United States Patent [19]
Watanabe et al.

[11] Patent Number: 5,668,506
[45] Date of Patent: Sep. 16, 1997

[54] TEMPERATURE COMPENSATED CRYSTAL OSCILLATOR

[75] Inventors: Takao Watanabe, Higashikurume; Mutsuo Hayashi; Kazunari Matsumoto, both of Yonezawa; Chikara Tsuchiya, Machida; Eiji Nishimori, Yokohama; Takashi Matsui, Kasugai, all of Japan

[73] Assignees: Kabushiki Kaisha Meidensha, Tokyo; Fujitsu Limited, Kawasaki, both of Japan

[21] Appl. No.: 653,748

[22] Filed: May 23, 1996

[30] Foreign Application Priority Data

May 25, 1995 [JP] Japan ................................ 7-126058
Aug. 18, 1995 [JP] Japan ................................ 7-210333

[51] Int. Cl.⁶ ................................ H03B 5/04; H03B 5/36
[52] U.S. Cl. .................... 331/66; 331/116 FE; 331/158; 331/176; 331/177 V; 310/315
[58] Field of Search ................................ 331/66, 116 R, 331/116 FE, 108 C, 158, 176, 177 V; 310/315

[56] References Cited

U.S. PATENT DOCUMENTS

| 5,341,112 | 8/1994 | Haman | 331/176 X |
| 5,355,098 | 10/1994 | Iwasaki | 331/17 X |
| 5,548,252 | 8/1996 | Watanabe et al. | 331/176 |

*Primary Examiner*—David Mis
*Attorney, Agent, or Firm*—Foley & Lardner

[57] ABSTRACT

In a digital temperature compensated crystal oscillator, ADC circuit and DAC circuit are combined into a data conversion circuit which comprises a first section for DA conversion, a second section for converting an analog temperature voltage signal into a digital form in cooperation with the first section, and a third section for supplementing the DA conversion of the first section and thereby generating an analog control voltage for a VCO from a digital temperature compensation data. There is further provided a switch circuit for connecting the output of the first section to either of the second and third section.

25 Claims, 18 Drawing Sheets

FREQUENCY-TEMPERATURE
CHARACTERISTIC

FREQUENCY-TEMPERATURE
CHARACTERISTIC

TEMPERATURE COMPENSATED CRYSTAL OSCILLATOR

BACKGROUND OF THE INVENTION

The present invention relates to a temperature compensated crystal oscillator (TCXO).

Recent advances in IC technology and related technology promote size reduction and cost reduction in equipment for mobile communication such as devices or telephone sets for portable, mobile and cordless telephone systems. This progress increases the number of subscribers and users of the radio communication systems, and the carrier frequency spacing (12.5 KHz, for example) and the modulation band width (5 KHz, for example) are decreased. Therefore, a source of oscillation frequency is required to fulfill a severe requirement of the frequency stability. For example, the frequency stability must be equal to or lower than 1 ppm;

$$|\Delta f/f| \leq 1 \ ppm. \tag{1-1}$$

There is known a digital temperature compensated crystal oscillator (DTCXO) capable of satisfying the requirement of the expression (1-1) in a wide temperature range of −40° C.~85° C.

FIG. 7 shows a conventional DTCXO system which includes a temperature to voltage coverting circuit 10 for sensing an ambient temperature of a crystal unit 19 and producing an analog temperature voltage Vt representing the sensed temperature, and an analog to digital converter (ADC) circuit 11 for converting the analog voltage signal Vt to a digital temperature data signal T. For example, the digital temperature data signal T is a 10 bit signal. This temperature data signal T is supplied to a memory and operation circuit 12 comprising devices such as $E^2PROM$ and logic array. The memory and operation circuit 12 stores a collection of compensation data items V (10 bit data, for example) for the temperature compensation of the crystal unit 19. The compensation data item V corresponding to the temperature data T is obtained directly or through a converting operation, and outputted through a register (not shown) as a digital compensation data signal V1. This signal V1 is inputted to a digital to analog converter (DAC) circuit 13 and converted into a analog voltage signal Vcw. The analog voltage signal Vcw is sent from the digital to analog converter circuit 13 to a sample hold and low pass filter circuit 14, in which the analog voltage signal Vcw first undergoes a sample and hold operation, and then is smoothed by a low pass filter (LPF) having a proper time constant (5 ms, for example). The smoothed signal is outputted as a control voltage Vc from the sample hold and low pass filter circuit 14. The control voltage Vc is supplied to a voltage to capacitance converting circuit 15 comprising a variable capacitor, a resistor and a semiconductor switch, etc. The voltage to capacitance converting circuit 15 provides, between output terminals 15A and 15B, an equivalent capacitance Cc corresponding to the control voltage Vc in a manner of one-to-one linear correspondence.

An inverting amplifier 16 is composed of a semiconductor amplifier having a MOS transistor, for example. The inverting amplifier 16 forms a crystal oscillator circuit with the crystal oscillator unit 19 and the equivalent capacitance Cc across the output terminals 15A and 15B of the voltage to capacitance converting circuit 15. The capacitance Cc is connected in series (or in parallel) with the crystal unit 19. Thus, the inverting amplifier 16 performs the temperature compensation by using the capacitance Cc varying in accordance with the temperature, and provides, at an output terminal 16A, a constant frequency signal voltage independent of changes in the ambient temperature.

An auxiliary circuit 17 is a circuit having sub-functions common to the above-mentioned circuits. The auxiliary circuit 17 performs the following functions.

The auxiliary circuit 17 gets an external power supply from an input terminal 17A and directly supplies a voltage, a voltage reference, as a regulator, to each of the above mentioned circuits. The auxiliary circuit 17 enables data writing and reading operations to and from $E^2PROM$ through an interface terminal 17B, and performs a switching operation between a run mode and a test mode. Furthermore, the auxiliary circuit 17 functions to control the starting operation, and to control the compensation timing.

The above-mentioned circuits are integrated in a one chip LSI 18, as shown in FIG. 7. The resulting small sized DTCXO can provide the temperature compensation of ±1 ppm or less by using a crystal unit varying by 15 ppm, for example, in a wide temperature range.

As the demand in the mobile communication system for small size, light weight, low power consumption and low cost grows especially for portable devices, the DTCXO attracts more attention. In addition to the above-mentioned crystal unit 19 and the one chip LSI 18, the DTCXO includes two to four small chip capacitors for the filter of the sample hold and low pass filter circuit 14 and the voltage stabilization of the auxiliary circuit 17. These components are assembled in a package having interconnections and electrode pads (such as 16A, 17A and 17B shown in FIG. 7) for connection with external devices. All these components are improved to reduce the size, power consumption and cost individually or in combination. However, the improvement in the one chip LSI is most effective. The one chip LSI 18 includes both analog circuit components and digital circuit components. Therefore, the LSI layout design must be made small to lessen noise coupling among inner circuit components. Furthermore, the fabrication process is required to be continuous. Therefore, it is not easy to accomplish the object of reducing the size and cost.

FIGS. 8 and 9 show a conventional ADC circuit 11 and a conventional DAC circuit 13.

The ADC circuit 11 shown in FIG. 8 includes a bias generating circuit 20 for generating a bias 2·VB (VB is a base voltage temperature correction of Vt), a dual slope integration circuit 21, a comparator 22 and an output section 23 comprising a clock, a control circuit for controlling switches SW2j (where j is 1, 2 or 3), a down counter and its register. The T data signal is obtained at the output of the section 23. The control circuit in the section 23 is connected, as shown at 23A, with the switches SW2j.

The bias generating circuit 20 comprises an operational amplifier OP1, a transistor TR and resistors R and R4. The operational amplifier OP1 has a plus input terminal receiving VB, a minus input terminal receiving the voltage Vt from the temperature to voltage converting circuit 10, and an output terminal delivering a biased voltage (2VB−Vt). This biased voltage is supplied to a plus input terminal of the comparator 22. The dual slope integration circuit 21 has a series arrangement of three resistors R21, R22 and R23 connected across a regulated power supply for providing fractional voltages V21 and V22 by these three resistors, an operational amplifier OP2 having a minus input terminal receiving the fractional voltage V21 from a branch point between the resistors R21 and R22 through a series combination of semiconductor switches SW21 and SW22, and a plus input terminal receiving the fractional voltage V22 directly from a branch point between the resistors R22 and R23, a capacitor C21 provided between a branch point between the semiconductor switches SW21 and SW22 and the ground, and a parallel circuit of a capacitor C22 and a semiconductor switch SW23 connected between the minus input terminal and output terminal of the operational amplifier OP2.

The DAC circuit 13 shown in FIG. 9 has a dual slope integration circuit 31 having the same construction as the dual slope integration circuit 21 of the ADC circuit 11 shown in FIG. 8, a semiconductor switch 32 disposed in a path for supplying the output of the integration circuit 31 to the sample hold and low pass filter circuit 14 and a register, counter and gate control circuit 33 which is connected by one or more lines 33A with the switches SW3j.

The integration circuits of the ADC circuit 11 and the DAC circuit 13 are of the double integration type, which can significantly contribute to the size reduction by reducing the numbers of semiconductor switches, resistors and capacitors. However, the following inequality (1-2) exists in general between both circuits though the T data of the ADC circuit 11 and the V1 data of the DAC circuit 13 are identical in word length (10 bits, for example).

$$(2VB-Vt)_{(max)} \neq Vcw_{(max)} \qquad (1\text{-}2)$$

Therefore:

$$V24 \neq V34 \qquad (1\text{-}3)$$

As a result, both circuits require different capacitors and resistors as follows:

$$C2j \neq C3j, R2j \neq R3j \qquad (1\text{-}4)$$

Furthermore, the LSI configuration of the dual slope integration circuits poses the following three problems.

(i) When each of the temperature data T and the V1 data is 10-bit data, the relationship between the capacitors Ci2 and Ci1 (where i is 2 or 3) is given by:

$$Ci2/Ci1 = 1025 \times Vi3/Vi4_{(max)} \qquad (1\text{-}5)$$

In the expression (1-5), the capacitor Ci2 can not be increased for the size reduction of the LSI, and accordingly, the capacitor Ci2 is set at 100 pF, for example. In this case, Ci1 is equal to or smaller than 1 pF when $(Vi3/Vi4_{(max)})=0.1$. With such a small capacitance, the system is readily affected by noise.

(ii) Since a low resistance switch is difficult to obtain for the size reduction of LSI, the time τ for a single OFF-ON-OFF cycle of the semiconductor switch SWij is long, and moreover the semiconductor switches SWi1 and SWi2 are operated alternately. Therefore, the integration time becomes equal to or longer than 2050 τ when the T data and V1 data are 10 bits. Assuming τ=0.1 ms, the integration time is as long as 205 ms.

(iii) Because of a synergistic effect produced by a combination of the factors mentioned in (i) and (ii) above, the system becomes more susceptible to noise, and the ADC and DAC circuits become less reliable.

SUMMARY OF THE INVENTION

It is therefore an object of the present invention to provide a temperature compensated crystal oscillator which is advantageous in size reduction and cost reduction.

It is another object of the present invention to provide a digital temperature compensated crystal oscillator system having ADC and DAC circuit sections which are short in conversion time and less susceptible to noise.

A digital temperature compensated crystal oscillator system according to the present invention comprises:

a crystal oscillating section which comprises a crystal unit;

a temperature to voltage converting circuit for sensing an ambient temperature of said crystal unit and outputting an analog temperature voltage signal representing a sensed ambient temperature;

a memory and operation circuit for storing a collection of temperature compensation data items, receiving a digital temperature data signal as an input signal, providing a selected data item identified by said digital temperature signal, and producing a digital compensation data signal in accordance with said selected data item; and a data conversion circuit for producing said digital temperature data signal in accordance with said analog temperature voltage signal from said temperature to voltage converting circuit, and for producing an analog compensation voltage signal in accordance with said digital compensation data signal from said memory and operation circuit, said data conversion circuit comprising a first section for producing an analog intermediate signal, a second section for producing said digital temperature data signal by converting said analog temperature voltage signal in accordance with said analog intermediate signal and delivering said digital temperature data signal to said memory and operation circuit, and a third section for producing said analog compensation voltage signal by converting said digital compensation data signal through said first section.

This arrangement eliminates the necessity of providing the analog to digital converter circuit and the digital to analog converter circuit separately, so that it is possible to reduce the size of the entire system.

According to another aspect of the present invention, a temperature compensated crystal oscillator system comprises:

a crystal unit having a first end and a second end which is connected to a ground;

a MOS transistor comprising a drain, a source and a gate which is connected to said first end of said crystal unit;

a gate voltage fixing resistor connected between the drain and gate of the MOS transistor;

a source resistor connected between the source of the MOS transistor and the ground;

a series circuit of a detecting capacitor and a feedback semiconductor capacitor constituting a Colpitts oscillator circuit; and a decoupling capacitor connected between the source of the MOS transistor and a node between the detecting and feedback capacitors.

Preferably, the semiconductor capacitor is a transistor type capacitor (or junction capacitor) in which collector and emitter serve as an anode, a base serve as a cathode and a capacitance due to a depletion layer varies in dependence on an applied voltage. A preferred embodiment of the invention is basically arranged to utilize the capacitance without applying a voltage. The temperature coefficient of this semiconductor capacitor is extremely high and equal to or higher than +2.000 ppm/°C. This feature is used for temperature frequency compensation for the crystal unit.

DETAILED DESCRIPTION OF THE INVENTION

Figure 1:
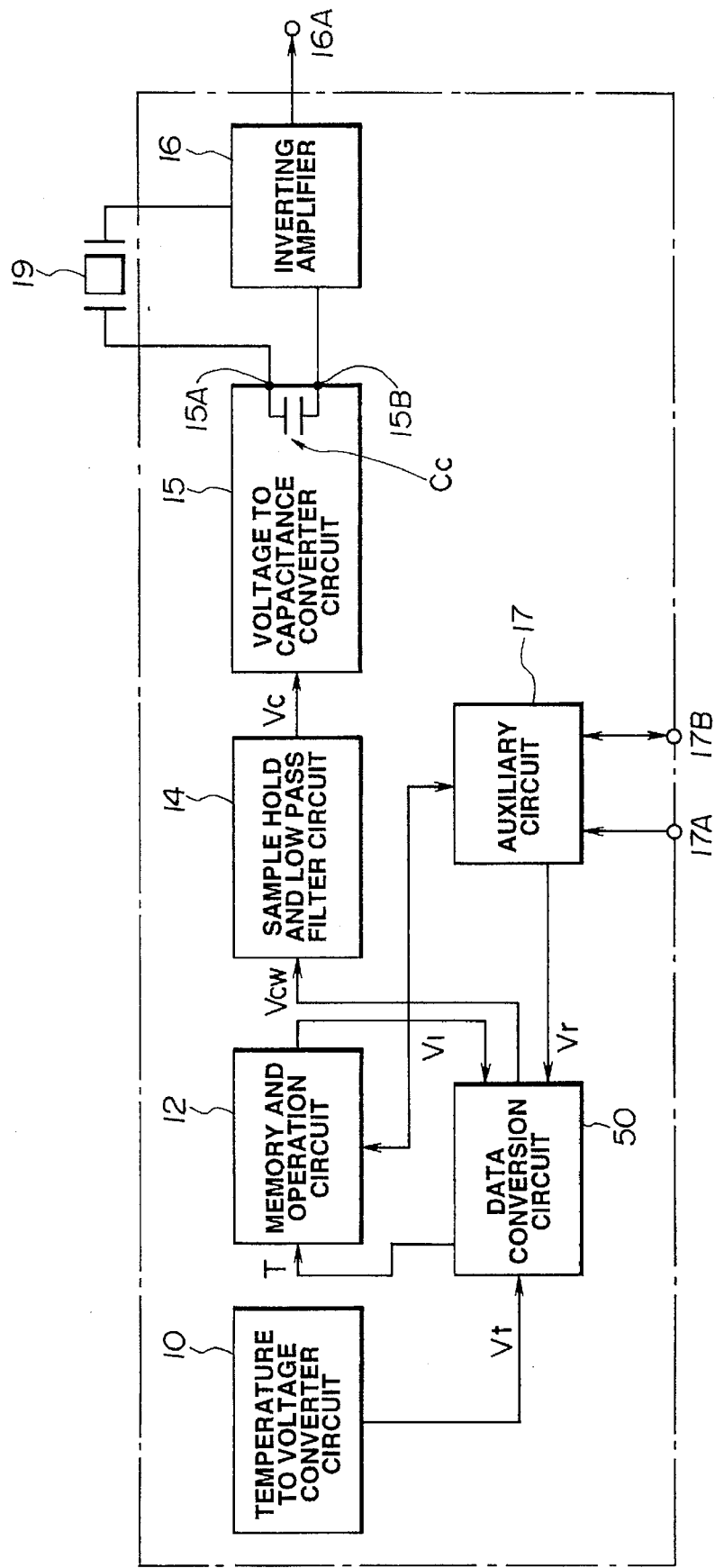
FIG. 1 is a block diagram showing a first practical example of the present invention.
Figure 7:
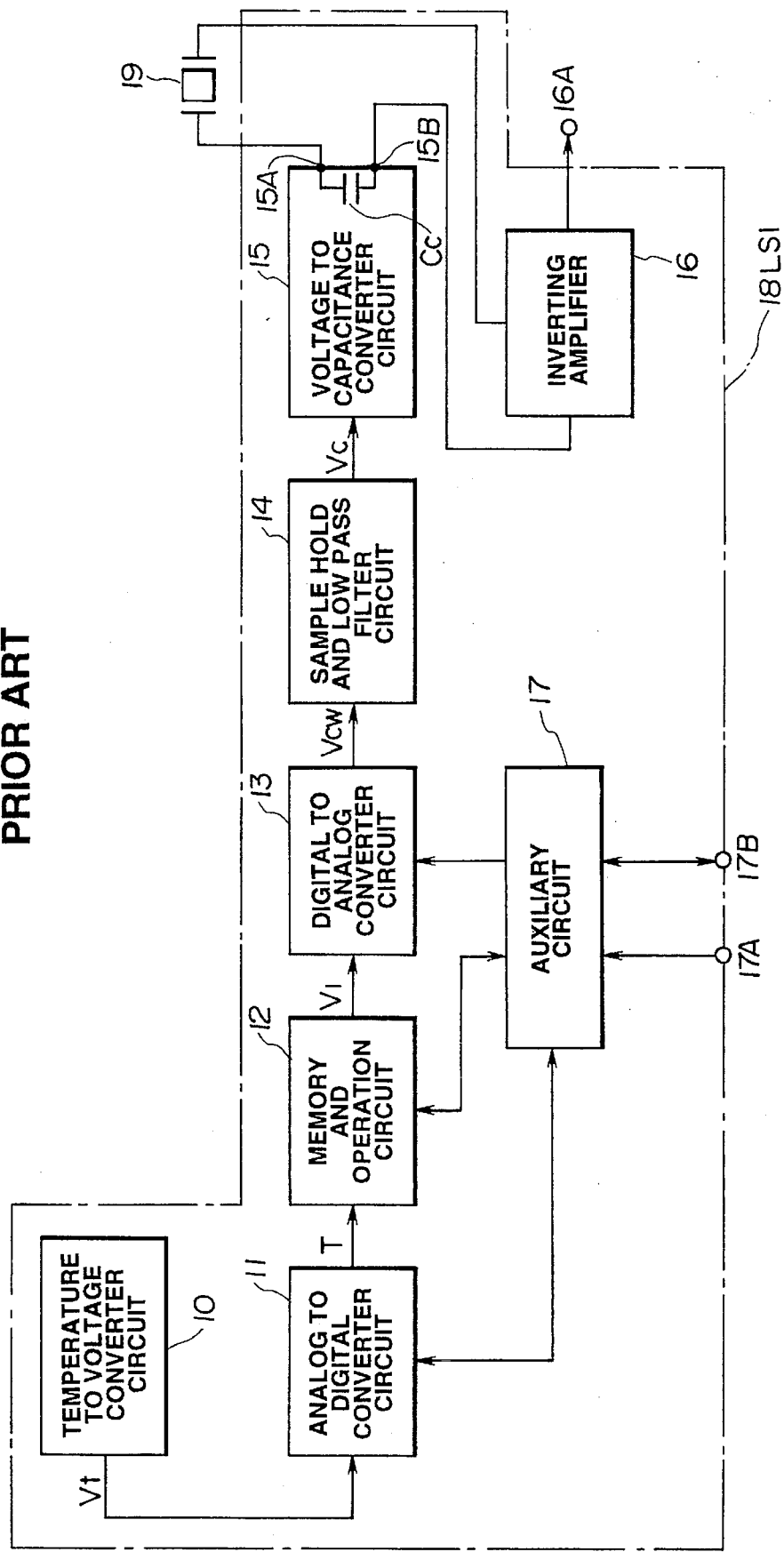
FIG. 7 is a block diagram showing a conventional DTCXO system.
Figure 8:
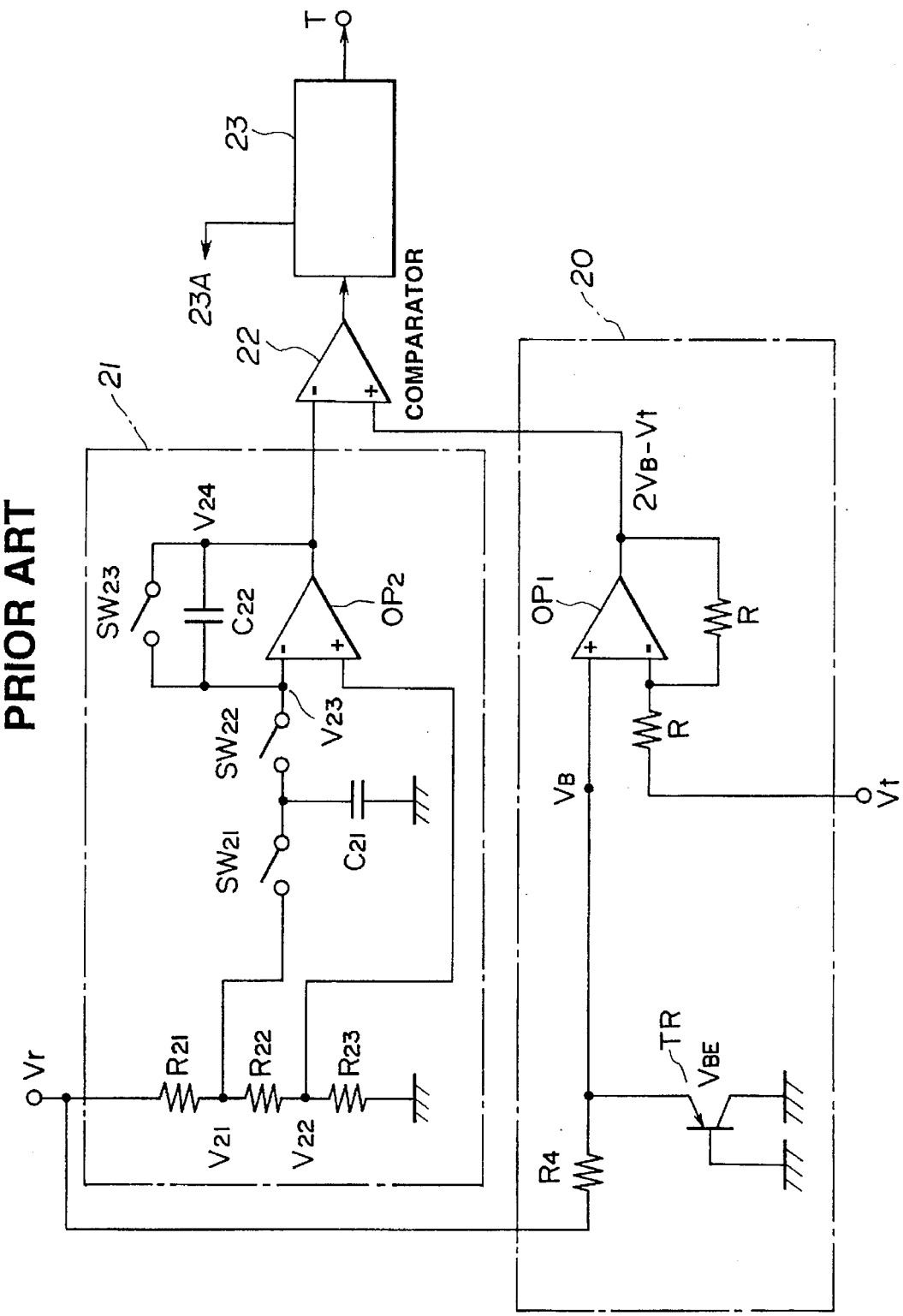
FIG. 8 is a diagram showing a conventional analog to digital converter circuit.
Figure 9:
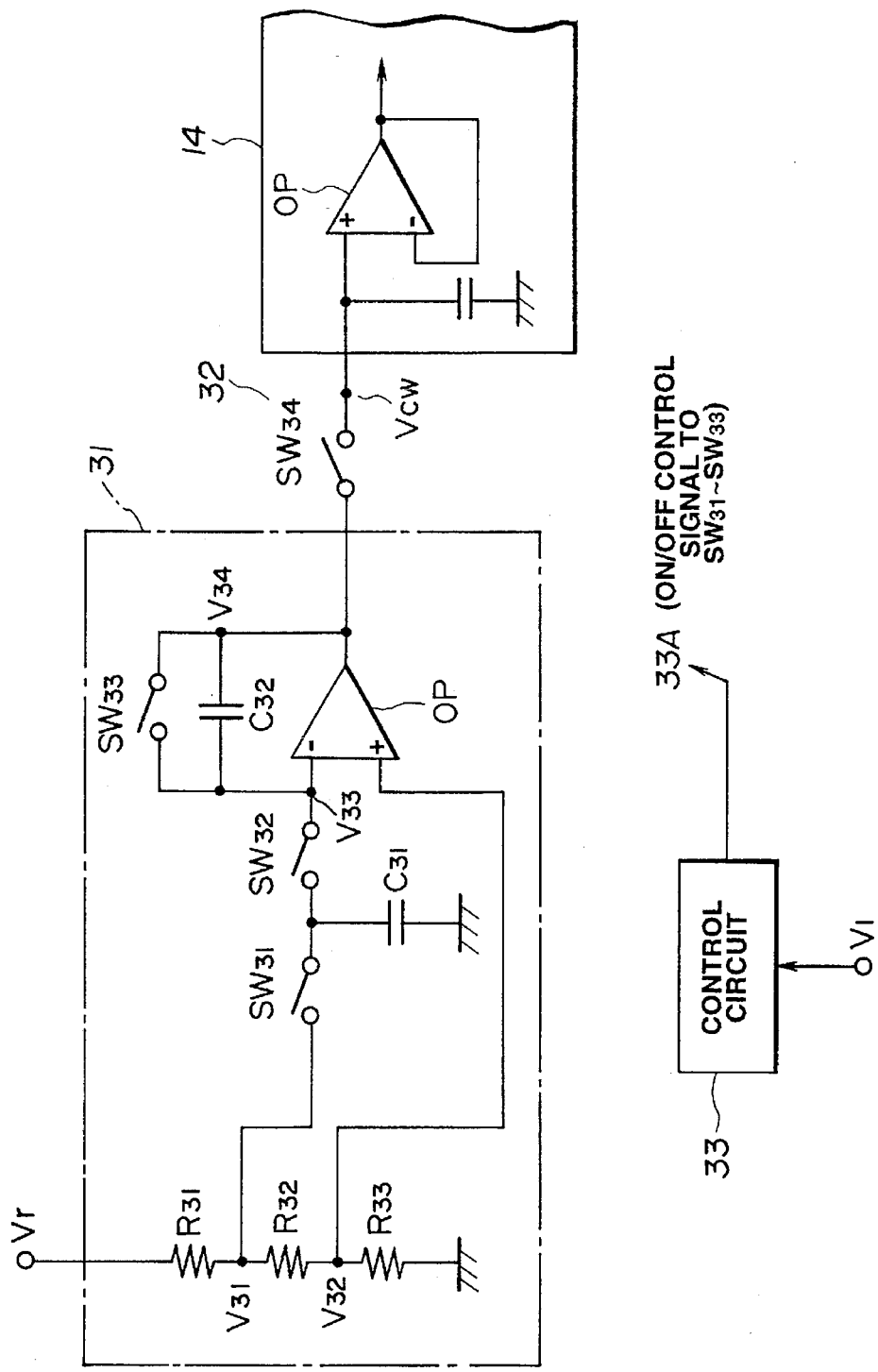
FIG. 9 is a diagram showing a conventional digital to analog converter circuit.

A first practical example according to a first embodiment of the present invention is shown in FIG. 1. A digital temperature compensated crystal oscillator system shown in FIG. 1 comprises a temperature to voltage converter circuit 10, a memory and operation circuit 12, a sample hold and low pass filter circuit 14, a voltage to capacitance converting circuit 15, an inverting amplifier 16, an auxiliary circuit 17 and a crystal unit 19 as in the conventional system shown in FIG. 7.

The temperature compensated crystal oscillator system shown in FIG. 1 further includes a data conversion circuit 50 which receives an analog temperature voltage signal Vt from the temperature to voltage converter circuit 10, a digital compensation data signal V1 from the memory and operation circuit 12 and a voltage reference Vr from the auxiliary circuit 17. The data conversion circuit 50 produces a digital temperature signal T by conversion and delivers the signal T to the memory and operation circuit 12. Furthermore, the data conversion circuit 50 produces an analog (voltage) signal Vcw, and supplies this signal Vcw to the sample hold and low pass filter circuit 14. After the sample hold operation on the analog signal Vcw, the circuit 14 performs a smoothing operation with a low pass filter (LPF) having an adequate time constant (5 ms, for example). The circuit 14 produces a control voltage Vc by the smoothing operation, and supplies the control voltage Vc to the voltage to capacitance converting circuit 15 comprising a variable capacitor, a resistor, a semiconductor switch, etc. The voltage to capacitance converting circuit 15 provides an equivalent capacitance Cc corresponding to the control voltage Vc between output terminals 15A and 15B. The equivalent capacitance Cc is in a one-to-one linear correspondence with the control voltage Vc.

The inverting amplifier 16 is composed of a semiconductor amplifier having a MOS transistor, for example. The inverting amplifier 16 constitutes a crystal oscillator circuit with the crystal oscillator unit 19 and the equivalent capacitance Cc which is connected in series with the crystal unit 19. Thus, the inverting amplifier 16 performs the temperature compensation by using the capacitance Cc varying in accordance with the temperature, and provides, at an output terminal 16A, a constant frequency voltage signal independent of changes in the ambient temperature.

Figure 2:
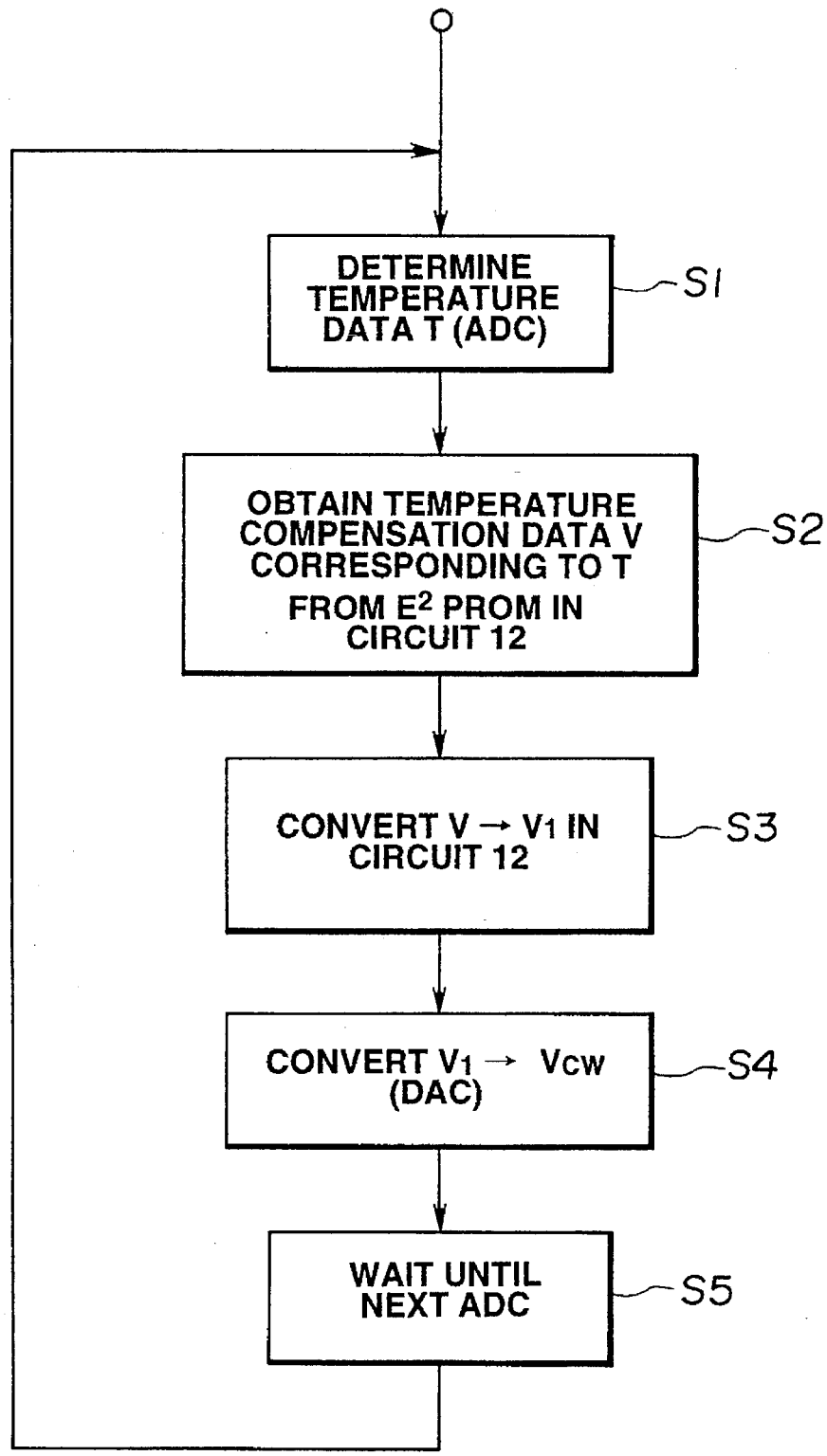
FIG. 2 is a flow chart showing a sequence of operations according to the first practical example.

FIG. 2 shows an operation sequence of the data conversion circuit 50. When the analog voltage Vt corresponding to the temperature is inputted from the temperature to voltage converter circuit 10 into the data conversion circuit 50, the data conversion circuit 50 determines the digital temperature data T by performing an analog to digital converting operation at a step S1. At a step S2, the circuit 12 having a memory of E²PROM receives the digital temperature data T as an address input signal, and provides a temperature compensation data V corresponding to the address input. The temperature compensation data V is processed, at a step S3, to obtain data V1 in the circuit 12, and the data V1 is sent back to the data conversion circuit 50. The steps S2 and S3 are operations in the circuit 12. The data V1 is converted, at a step S4, into an analog voltage Vcw by an digital to analog converting operation, and inputted to the sample hold and low pass filter circuit 14. Thereafter, at a step S5, a waiting time operation for the next ADC is performed, and the system returns to the step S1. The auxiliary circuit 17 has a circuit for carrying out the sequence of these operations.

Figure 3:
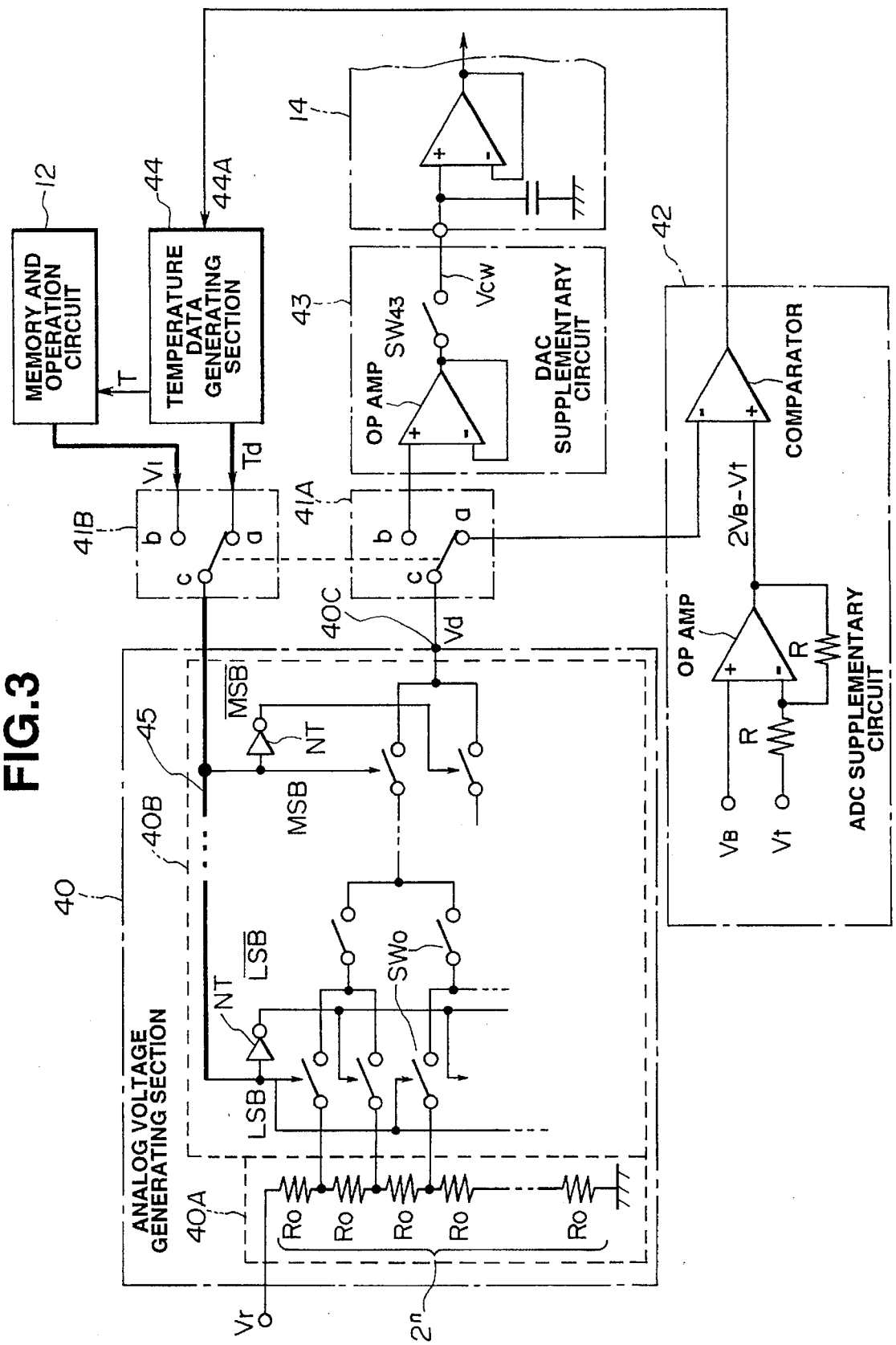
FIG. 3 is a diagram showing a data conversion circuit shown in FIG. 1.

FIG. 3 shows the data conversion circuit 50 more in detail. The data conversion circuit 50 has an analog voltage generating section 40 constituted by a resistor string circuit 40A and a decode switch circuit 40B. The resistor string circuit 40A employs a series combination of unit resistors in view of the ease in fabrication process. As shown in FIG. 3, resistors R0 are connected in series so as to provide $2^n$ voltage levels by using the voltage reference Vr. Switches are arranged to select one voltage level corresponding to a digital input. In this way, the resistor string circuit 40A is in the form of a resistor string. It is optional to employ a known (R-2R) ladder type circuit to which the following principle applies. The $2^n$ resistors R0 (n is the number of bits) and switches are required so that the required area for the resistors may be increased. However, the switches can be made small in size as mentioned later, and the arrangement does not increase the size of the LSI. The decode switch circuit 40B of this example comprises semiconductor switches SW0 and NOT circuits NT which are connected as shown in FIG. 3.

The analog voltage generating section 40 is used for both of the ADC function and DAC function. The analog voltage generating section 40 is connected through a first selector switch circuit 41A to an ADC supplementary circuit 42 and a DAC supplementary circuit 43. The ADC supplementary circuit 42 is added to complete an ADC circuit. The DAC supplementary circuit 43 is added to complete a DAC circuit. The switch 41A can select one of the supplementary circuits 42 and 43. A second switch circuit 41B is connected with the switch circuit 41B. The ADC supplementary circuit 42 is operated when a movable contact c of the switch 41A is held in contact with a first stationary contact a. On the other hand, the DAC supplementary circuit 43 is connected with the analog voltage generating section 40 when the movable contact c of the switch 41A is in contact with a second stationary contact b.

The ADC supplementary circuit 42 comprises an operational amplifier OP AMP and a comparator. The comparator output 44A of the ADC supplementary circuit 42 is supplied to a temperature data generating section 44, which comprises a down counter (or an up counter in some cases), a T register and a sequence logic section. The down counter and the T register (which is the output of the down counter) are initially set up in a full count state. The down counter counts down in accordance with the comparator output information 44A of the ADC supplementary circuit 42, and each time updates a value Td of the T register. The signal Td is delivered through a stationary contact a of the switch 41B to the decode switch circuit 40B, and the analog voltage (analog intermediate signal) Vd corresponding to Td appears at an output 40C of the analog voltage generating section 40. The analog voltage Vd is inputted through the stationary contact a of the switch circuit 41A to the comparator of the ADC supplementary circuit 42. When the comparator output information 44A becomes equal to zero, the count down operation stops and the temperature data T is obtained. This operation corresponds to the step S1 shown in FIG. 2. The temperature data T is delivered to the memory and operation circuit 12. Thus, the temperature data generating section 44, the analog voltage generating section 40 and the ADC supplementary circuit 42 cooperate with one another, and work as an analog to digital converter.

At the step S4 shown in FIG. 2, the movable contacts c of the switch circuits 41A and 42B are moved together, and connected with the respective second stationary contacts b in response to a command signal from the auxiliary circuit 17. Therefore, the output V1 of the memory and operation circuit 12 is sent to the decode switch circuit 40B, and the analog voltage Vd corresponding to V1 is obtained at the output 40C of the analog voltage generating section 40. The analog voltage Vd is supplied to an operational amplifier OP AMP of the DAC supplementary circuit 43, and the analog voltage Vcw is obtained through a switch SW43 in an on state. In this example, Vcw is equal to Vd. The analog voltage Vcw is supplied to the sample hold and low pass filter circuit 14, and the DAC operation is finished. In this example, a bus 45 of the decode switch circuit 40B has n lines. Accordingly, the number of lines of each of a bus for V1 and a bus for Td is also equal to n. There are provided, in the semiconductor switch circuit 41B, a plurality of the contacts a, a plurality of the contacts b and a plurality of the contact c, and the numbers of the contacts a, b and c of the semiconductor switch circuit 41B are all equal to n.

In this example, the second switch circuit 41B is in a first switch state in which the contact c is connected with the contact a when the first switch circuit 41A is in a first switch state in which the contact c is connected with the contact a, as shown in FIG. 3. When the first switch circuit 41A is in a second switch state in which the contact c is connected with the contact b, the second switch circuit 41B is also in a second switch state in which the contact c is connected with the contact b.

Figure 4:
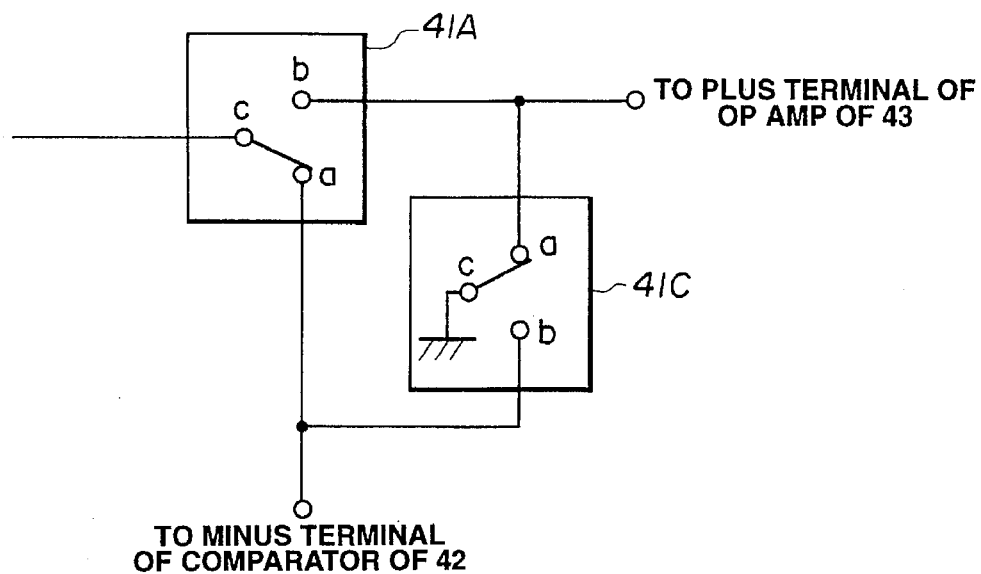
FIG. 4 is a block diagram showing a second practical example of the present invention.

A second practical example according to the first embodiment of the present invention is shown in FIG. 4. In this example, a third switch circuit 41C is provided between the first and second stationary contacts a and b of the first switch circuit 41A. The third switch circuit 41C has a first stationary contact a connected with the second stationary contact b of the first switch circuit 41A, a second stationary contact b connected with the first stationary contact a of the first switch circuit 41A, and a movable contact c which is grounded. The DTCXO system of this example operates the movable contact c of the third switch circuit 41C immediately after an operation of the movable contact c of the first switch circuit 41A, and by so doing, connects the minus terminal of the comparator of the ADC supplementary circuit 42 and the plus terminal of the operational amplifier of the DAC supplementary circuit 43 alternately to the ground. The minus terminal of the comparator of the ADC supplementary circuit 42 is grounded when the ADC supplementary circuit 42 is out of use, and the plus terminal of the operational amplifier of the DAC supplementary circuit 43 is grounded when the DAC supplementary circuit 43 is inoperative. With this arrangement, the DTCXO system becomes less susceptible to noise.

Figure 5:
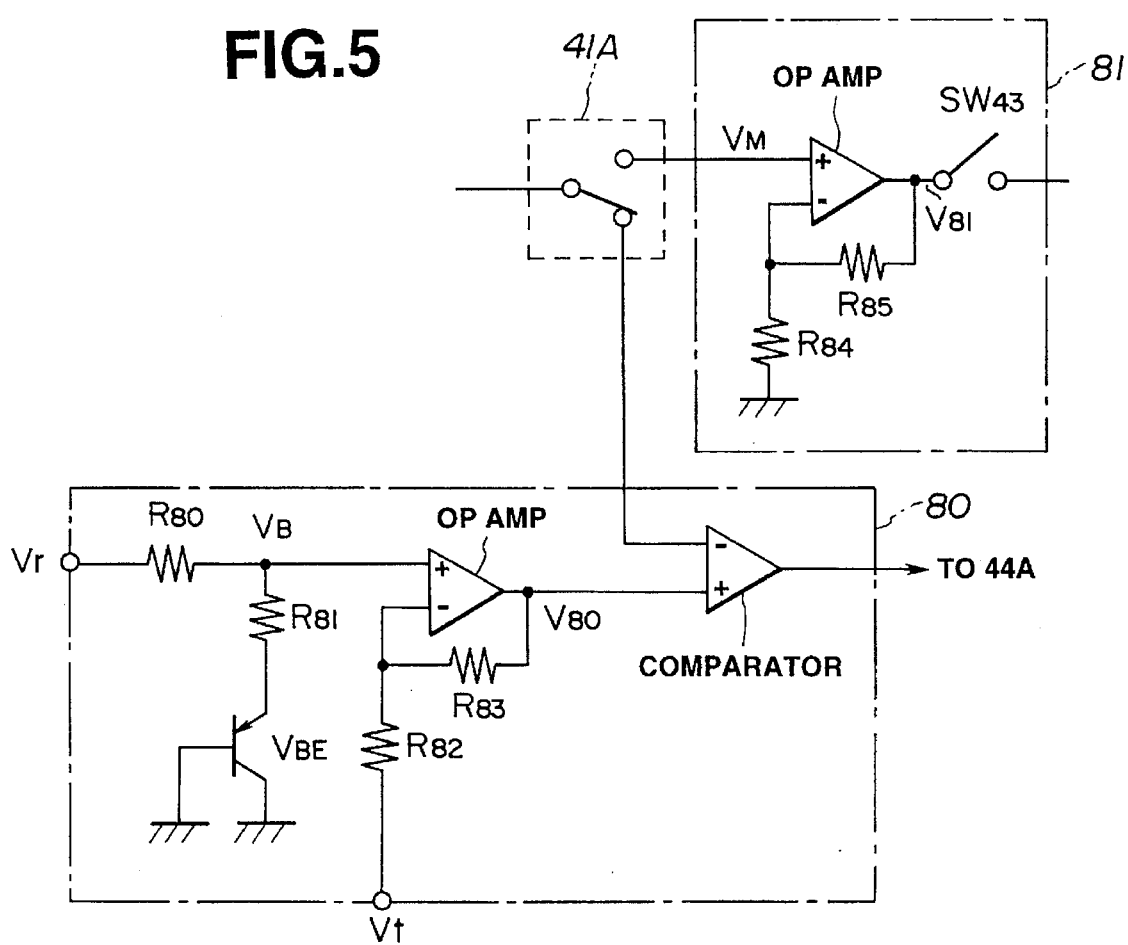
FIG. 5 is a circuit diagram showing a third practical example of the present invention.

A third practical example according to the first embodiment of the present invention is shown in FIG. 5. In an ADC supplementary circuit 80 shown in FIG. 5, two resistors used for the operational amplifier of the ADC supplementary circuit 42 are replaced by resistors R80~R83 which are arranged to set an output V80 of the operational amplifier suitably. Incidentally, the output of the operational amplifier of the ADC supplementary circuit 42 shown in FIG. 3 is (2VB−Vt). The operational amplifier of the DAC supplementary circuit 43 shown in FIG. 3 is a voltage follower whereas a DAC supplementary circuit 81 of the third practical example is arranged to form a positive amplifier with resistors R84 and R85. The third practical example can remedy the problem caused by the sharing of the analog voltage generating section 40.

Although the above-mentioned operational amplifiers and comparators are shown schematically, the actual circuits are in the form of a group of devices fabricated by a CMOS process. In the practical example shown in FIG. 5, the object of the ADC supplementary circuit 80 and the DAC supplementary circuit 81 is to offset the sensitivity of Vt of the ADC operation and the output data T at the room temperature appropriately while in the maximum output voltage (VM≈Vr) of the common analog voltage generating section 40, a bit weight is fixed (about Vr/1000 when n=10 and there are provided $2^n$ resistors R0), and to make the output voltage V81 of the DAC supplementary circuit 81 controllable for the full bits (in practice, the control of the sensitivity of the DAC operation is used).

The output voltage V80 of the operational amplifier of the ADC supplementary circuit 80 is expressed by:

$$V80 = \left(1 + \frac{R83}{R82}\right) VB - \frac{R83}{R82} \cdot Vt \quad (1\text{-}6)$$

The resistors R80 and R81 are used for controlling the bias voltage VB.

As shown in FIG. 5, the resistor R82 is connected between the minus input terminal of the operational amplifier OP AMP and the ground, the resistor R83 is between the minus input terminal and the output terminal of the operational amplifier OP AMP, the resistor R80 is between a terminal for receiving the voltage Vr and a branch point connected to the plus input terminal of the operational amplifier OP AMP, and the resistor R81 is between the above-mentioned branch point and the emitter of a bipolar transistor whose base and collector are grounded.

The output voltage V81 of the operational amplifier of the DAC supplementary circuit 81 is given by:

$$V81 = \left(1 + \frac{R85}{R84}\right) VM \quad (1\text{-}7)$$

As shown in FIG. 5, the resistor R84 is connected between one input terminal of the operational amplifier OP AMP of the circuit 81, and the ground, and the resistor R85 is between the one input terminal and the output terminal of the operational amplifier. The other input terminal of the operational amplifier is connected through the switch circuit 41A with the analog voltage generating circuit 40.

Figure 6:
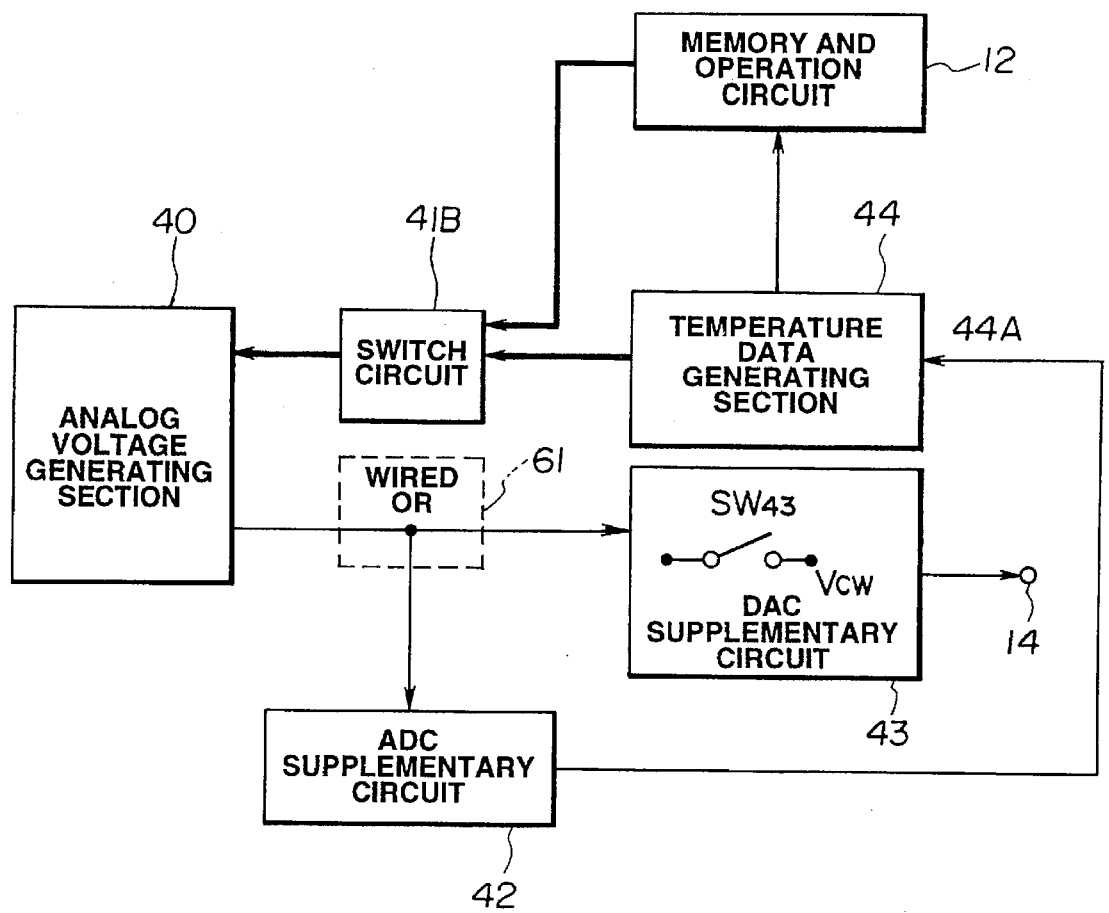
FIG. 6 is a block diagram showing a fourth practical example of the present invention.

A fourth practical example according to the first embodiment of the present invention is shown in FIG. 6. In this example, a wired OR 61 is substituted for the switch circuit 41A in the system shown in FIG. 3. The use of the wired OR 61 further contributes to the chip size reduction by eliminating the semiconductor switch circuit 41A and reducing interconnections inclusive of the control circuit. The fourth practical example does not require the cooperation between the switch circuits 41B and 41A. The wired OR circuit 61 is arranged to virtually switch the output of the analog voltage generating section 40 to the input of the ADC supplementary circuit 42 or the DAC supplementary circuit 43 by the technique of time sharing.

The system of the fourth practical example is operated as follows: The auxiliary circuit 17 functions to recognize each step shown in the flow chart of FIG. 2. At the step S1 of FIG. 2, the movable contact c of the second switch circuit 41B is connected to the stationary contact a, and the analog voltage generating section 40, ADC supplementary circuit 42 and temperature data generating section 44 are put in the operative state. The temperature data generating section 44 receives the output signal 44A from the ADC supplementary circuit 42, and determines the value of the T register by increasing (count up) or decreasing (count down) the count of the counter provided therein. Thereafter, the temperature data generating section 44 cuts the above-mentioned output signal 44A. During this, the operational amplifier of the DAC supplementary circuit 43 is operated through the wired OR circuit 61. However, the switch SW43 is held in the OFF state under the control of the auxiliary circuit 17, so that the DAC supplementary circuit 43 is ineffective.

When the system enters the step S3, the movable contact c of the second switch circuit 41B is connected with the second stationary contact b under the control of the auxiliary circuit 17, and the analog voltage generating section 40 provides, at the output 40C, the analog voltage Vd corresponding to the content of V1 register in the memory and operation circuit 12 (basically after two clock time intervals). At this time, the auxiliary circuit 17 turns on the switch SW43 by sending a signal, and the voltage Vcw is charged in a capacitor for the sample and hold operation in the sample hold and low pass filter circuit 14. Thereafter, the switch circuit SW43 is turned off. In this way, the fourth practical example can eliminate the switch circuit 41A. The fourth practical example can simplify the circuit configuration, and reduce the size and power consumption of the system.

In the case of the preceding practical examples of the present invention, in the system for producing an analog output signal from an analog input signal through digital process, in which a high speed follow up is not required, the DAC section for producing the analog output signal is further used for the AD conversion for converting the analog input. This arrangement is applicable not only to the digital temperature compensated crystal oscillator, but to various high accuracy compensation signal generating circuits as well. From the view point of the response speed, this design is specifically suitable to the temperature compensation signal generating circuit.

The preceding practical examples according to the first embodiment of the present invention can provide the following effects.

The use of the data conversion circuit can simplify the circuit configuration and enable the size reduction.

The resistor string circuit reduces the conversion time and increases the resistance against noise.

The resistor string circuit is used in common for both the ADC function and DAC function. This arrangement can reduce the area occupied by the resistor array approximately by half, and reduce the size of the LSI and the size of the whole of the DTCXO system.

As the semiconductor switches in the decode switch circuit, a high resistance device can be used because the connected terminal is a virtual zero point of the operational amplifier and no current flows. Therefore, it is possible to reduce the occupied area, and contribute to the size reduction of LSI and DTCXO.

The use of the circuit common to the ADC and DAC functions can reduce the power consumption of LSI, and reduce the cost by reducing the area of LSI.

A second embodiment of the present invention is explained in the following.

As mentioned before, recent advances in IC technology and related technology promote size reduction and cost reduction in equipment for mobile communication such as devices or telephone sets for portable, mobile and cordless telephone systems. This progress increases the number of subscribers and users of the radio communication systems, and the carrier frequency spacing (12.5 KHz, for example) and the modulation bandwidth (5 KHz, for example) are decreased. Therefore, a source of oscillation frequency is required to fulfill a severe requirement of the frequency stability. For example;

$$\left|\frac{\Delta f}{f}\right| -20°\text{C.}\sim 70°\text{C.} \leq 2.5 \text{ ppm} \quad (2\text{-}1)$$

$$\left|\frac{\Delta f}{f}\right| -35°\text{C.}\sim 85°\text{C.} \leq 1 \text{ ppm} \quad (2\text{-}2)$$

When the temperature range is narrow, it is possible to obtain a reasonable frequency to temperature stability by combining an AT cut crystal unit and an adequate oscillating circuit. However, it is impossible to satisfy the requirement (2-1) or (2-2) of a wide temperature range and a small variation.

Accordingly, there is provided a temperature compensating means on the oscillating circuit's side. For the requirement (2-1), a typical oscillator circuit is an analog direct type temperature compensated crystal oscillator (TCXO) in which a compensation circuit (which is a combination of at least one thermistor whose resistance varies with temperature, at least one fixed resistor, and at least one fixed capacitor) is connected in series with the AT cut plate (=crystal unit).

A digital temperature compensated crystal oscillator (DTCXO) can satisfy the requirement (2-2). With the above-mentioned TCXO, it is difficult to combine a wide temperature range, and a smaller amplitude or variation (1 ppm).

A typical example of DTCXO employs a voltage controlled crystal oscillator (VCXO) having a variable capacitor (or varicap) which is connected in series with the AT cut plate and which has the capacitance varying with a voltage. The VCXO is combined with a voltage generating circuit for temperature compensation. The voltage generating circuit includes a section for generating an analog voltage corresponding to the ambient temperature of the AT cut plate, an AD converting section for converting the analog voltage to a digital signal, a storage section for receiving the digital signal as an address input, and providing a compensation data signal corresponding to the temperature, a DA converting section for converting the digital compensation data signal to an analog control voltage, and a control section for controlling these sections and for decoding compressed compensation data.

The above-mentioned TCXO and DTCXO both inevitably increase the size and cost because of addition of the compensation circuit.

As mentioned before, the mobile communication system further requires smaller size, lower cost, and lower power consumption in addition to the stability requirement (2-1) or (2-2).

The frequency to temperature characteristic of the AT cut plate is unable to satisfy the requirement (2-1) as explained below. The frequency to temperature characteristic of the AT cut plate is in the form of a cubic function, and expressed as:

$$y_0 = ax_0^3 + bx_0^2 + cx_0 \qquad (2\text{-}3)$$

$$y_0 = \frac{\Delta f}{f} \text{ (ppm)}$$

$$x_0 = (T - T0)°C.$$

In the equation (2-3), y0 is a ratio of a variation $\Delta f$ to the natural frequency f of the AT plate, and x0 is a deviation of a temperature T (°C.) from a standard temperature T0 (20° C., for example). The coefficients a, b and c of the cubic, quadratic and linear terms of x0 are expressed by an angle of deviation $\Delta\theta$ from a reference normal line of a major surface of the AT cut plate.

$$a = a_0 + a_1 \cdot \Delta\theta$$

$$b = b_0 + b_1 \cdot \Delta\theta$$

$$c = c_0 + c_1 \cdot \Delta\theta \qquad (2\text{-}4)$$

The following is a numerical example.

$$\begin{vmatrix} a0, & a1 \\ b0, & b1 \\ c0, & c1 \end{vmatrix} = \begin{vmatrix} 1.164 \times 10^{-4}, & 0.0021 \times 10^{-4} \\ -0.270 \times 10^{-2}, & 0.0078 \times 10^{-2} \\ -0.070, & 0.0831 \end{vmatrix} \begin{vmatrix} (°C.)^{-3} \\ (°C.)^{-2} \\ (°C.)^{-1} \end{vmatrix} \qquad (2\text{-}5)$$

The coefficients a, b and c are affected by secondary factors other than the angle of deviation $\Delta\theta$, such as the size of the AT cut plate, the amount of beveling, the support structure, the material and amount of electrode. The influence of these secondary factors is minor. It is possible to hold the general appropriateness by correcting the angle of the reference normal.

By applying the following equation (2-6) offset with x00=T00 to eliminate the quadratic term in the equation (2-3);

$$x \equiv x_0 - x_{00} \qquad (2\text{-}6)$$
$$= T - T_0 - T_{00}$$

the following equation (2-7) can be obtained from the equation (2-3);

$$y_0 = a(x + x_{00})^3 + b(x + x_{00})^2 + c(x + x_{00}) \qquad (2\text{-}7)$$
$$= ax^3 + (3ax_{00} + b)x^2 + (3ax_{00}^2 + 2bx_{00} + c)x +$$
$$(ax_{00}^2 + bx_{00} + c)x_{00}$$

From the coefficient of the quadratic term in the equation (2-7);

$$x_{00} = -b/3a \qquad (2\text{-}8)$$

Substitution of the equation (2-8) into the equation (2-7) eliminates the quadratic term and yields;

$$y_0 = ax^3 + \left(c - \frac{b^2}{3a}\right)x + y_{00} \qquad (2\text{-}9)$$

$$y_{00} = \left(c - \frac{2b^2}{9a}\right)\left(\frac{-b}{3a}\right)$$

In this equation, y00 is a value of y0 when x=0, that is in the case of x00 offset. The quantity y00 is independent of the temperature, and adjustable during the process of fabricating the AT cut plate. Accordingly, we remove the $Y_{00}$ term from the equation (2-9) and obtain;

$$y = ax^3 + (c - b^2/3a)x \qquad (2\text{-}10)$$

The angle range of the AT cut plate is;

$$-10' < \Delta\theta < +3' \qquad (2\text{-}11)$$

Figure 19:
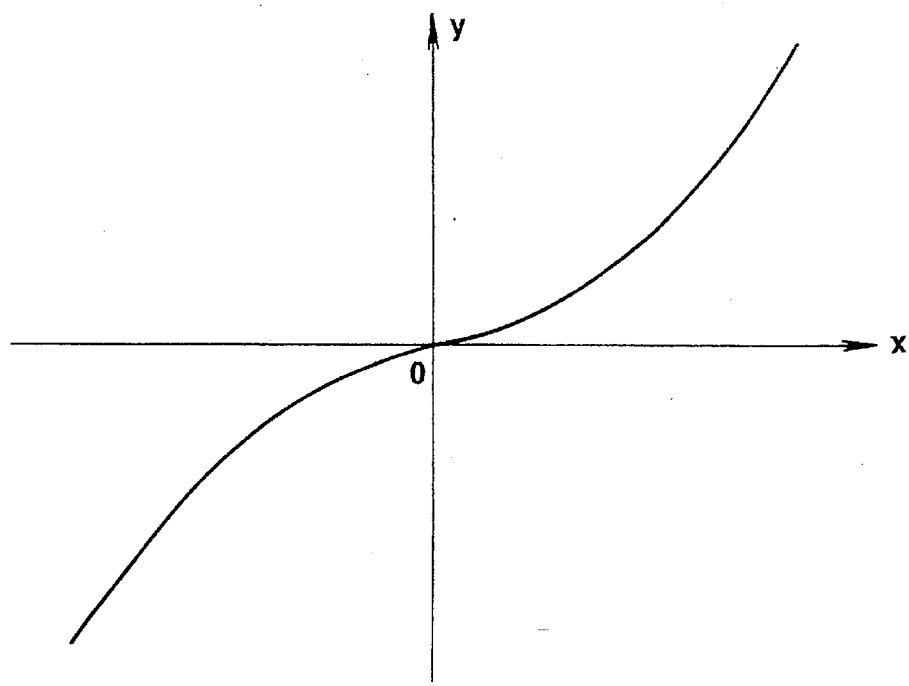
FIG. 19 is a graph showing a frequency to temperature characteristic of an AT cut crystal unit.
Figure 20:
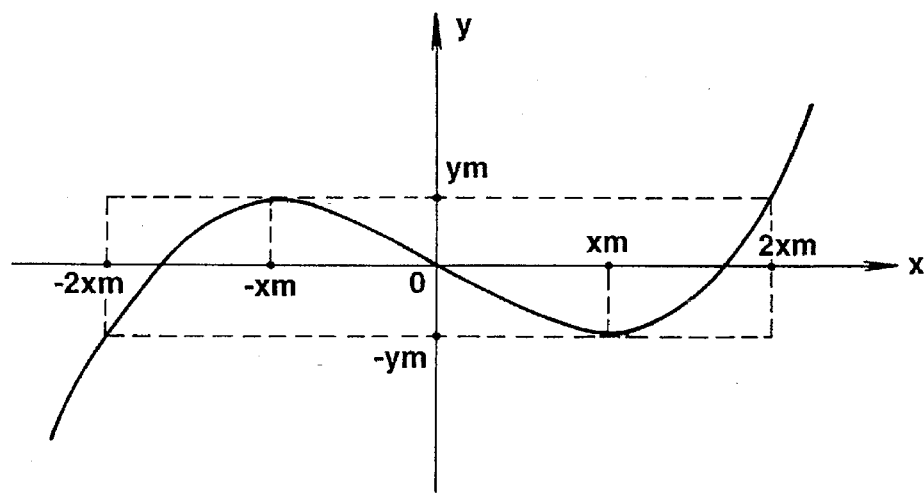
FIG. 20 is a graph showing a frequency to temperature characteristic of an AT cut crystal unit.

From the equations (2-4) and (2-5), a>0 and b<0. Then, the curve of the equation (2-10) slopes up to the right as shown in FIG. 19, and the function increases monotonically when $c \geq b^2/3a$. When, on the other hand, $c < b^2/3a$, the function is in the form of a wavy curve as shown in FIG. 20. The extremum values $(x_m, -y_m)$ in the curve of FIG. 20 are expressed by:

$$xm = -\frac{b}{3a}\sqrt{1 - \left(\frac{3ac}{b^2}\right)} \qquad (2\text{-}12)$$

$$-ym = -\frac{2}{27a^2}(b^2 - 3ac)^{3/2}$$

Thus, FIGS. 19 and 20 show typical frequency to temperature characteristics of the AT cut plate. An origin ($x_{00}$) where x=0 is a function of $\Delta\theta$ and given by;

$$x_{00} = \frac{-b}{3a} \qquad (2\text{-}13)$$
$$= -\frac{1}{3} \cdot \frac{(b_0 + b_1 \cdot \Delta\theta)}{(a_0 + a_1 \cdot \Delta\theta)}$$

Figure 21:
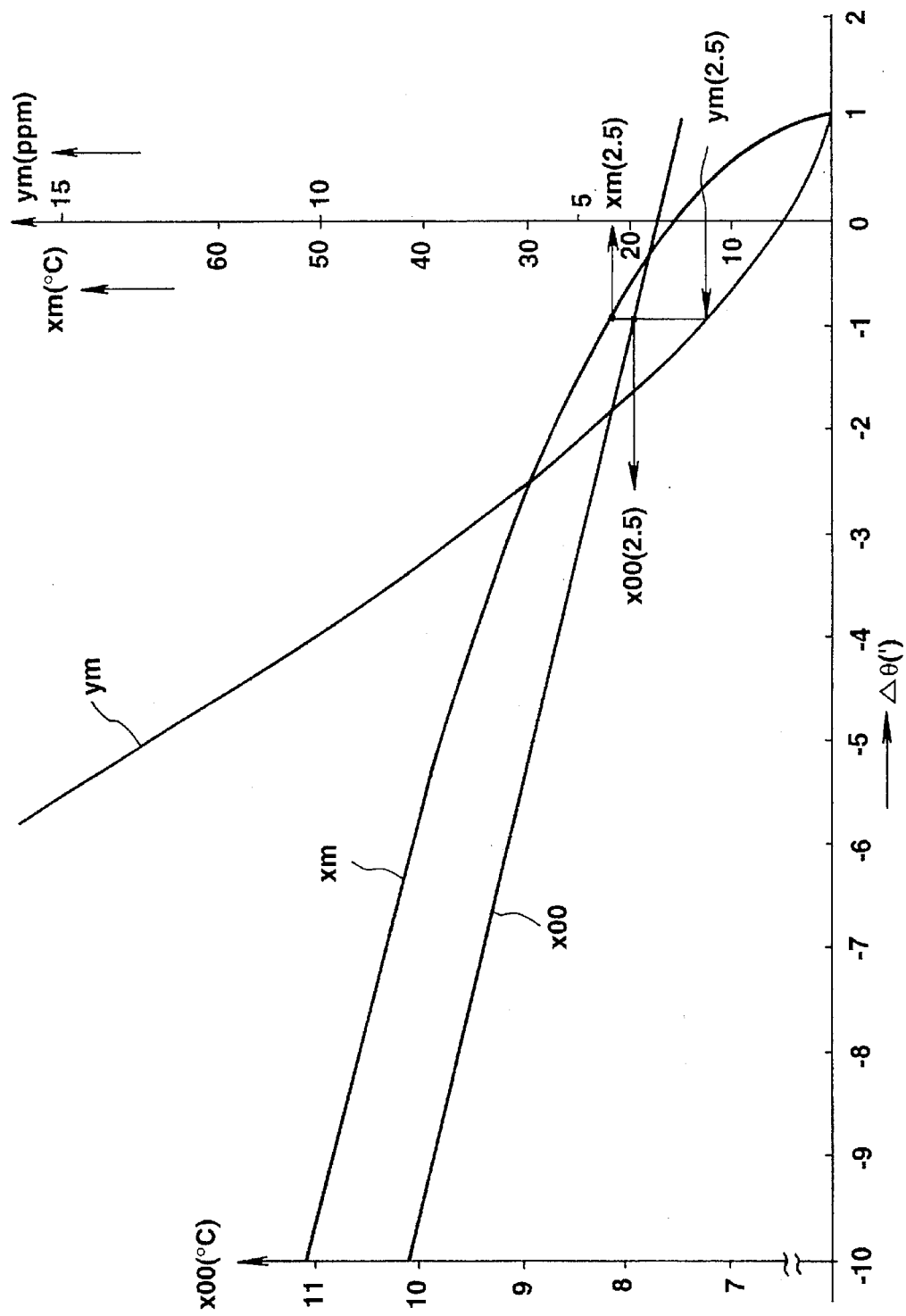
FIG. 21 is a graph showing curves of characteristic values ($y_m$, $x_m$, $x_{00}$) with respect to $\Delta\theta$.

Within the range of the expression (2-11), $x_{00}$ in the equation (2-13) is in a range of 7°~10.2° C. FIG. 21 shows curves of characteristic values ($y_m$, $x_m$, $x_{00}$) with respect to Δθ in the wavy curve. From FIG. 21, it is ascertained that the AT cut plate cannot satisfy the requirement (2-1). A horizontal line drawn to the left from a point ym (2.5) of 2.5 ppm intersects the ym curve at a point of intersection where Δθ is −0.935'. At the position of Δθ=−0.935', $x_{oo}$(2.5) is 7.95° C., and $y_m$(2.5) is 22.06° C. Namely, the temperature range of the AT cut plate in which the characteristic becomes wavy at 2.5 ppm is −17.17° C.~71.07° C., so that the performance in a low temperature range of −20° C.~−17° C. is unsatisfactory.

In the case of the AT cut plate having the monotonically increasing characteristic as shown in FIG. 19, the slope is smallest at $c=b^2/3a$, and therefore Δθ is equal to 1.08'. From the relationships (2-4), (2-5) and (2-10), the temperature range satisfying the requirement of ±2.5 ppm is 0°~55° C. This temperature range is not satisfactory.

TCXO can satisfy the requirement of (2-1). However, it is difficult to meet the requirement of (2-2) because of various technical problems.

Figure 22:
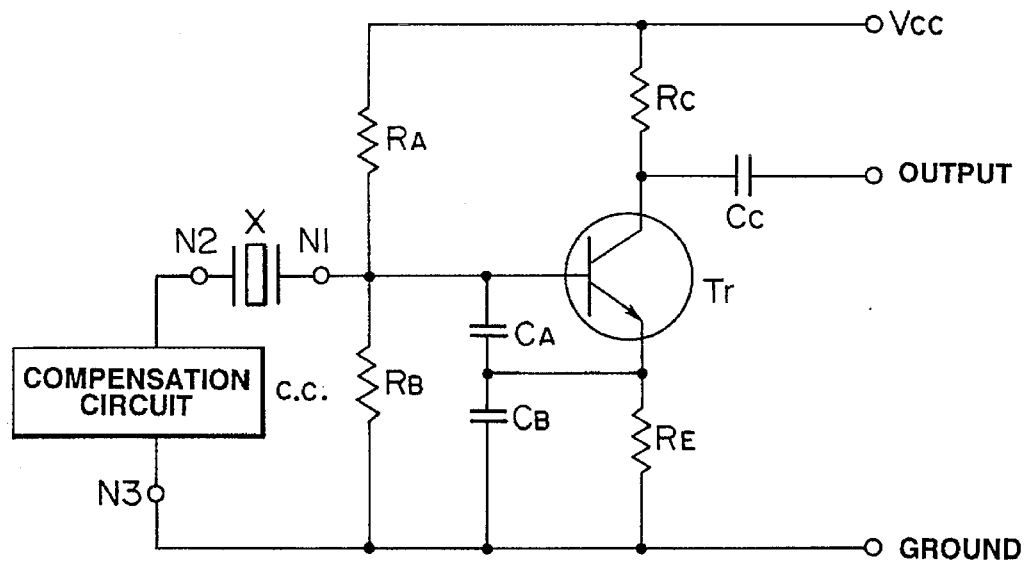
FIG. 22 is a circuit diagram showing a conventional Colpitts oscillator circuit.

FIG. 22 shows a conventional Colpitts oscillator circuit having a compensation circuit (C.C.) between nodes N2 and N3. According to the need, a room temperature frequency adjusting circuit (composed of a variable capacitor and a fixed capacitor) and a frequency voltage control circuit (composed of a variable capacitance diode, a capacitor, and a resistor) may be injected.

Figure 23A:
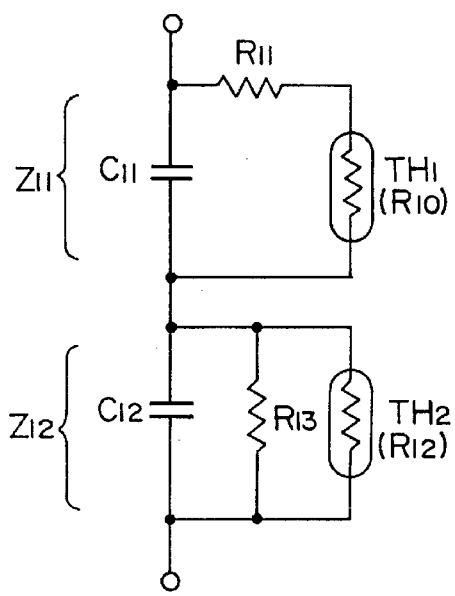
FIG. 23A is a circuit diagram showing a basic arrangement of the compensation circuit shown in FIG. 22.
Figure 23B:
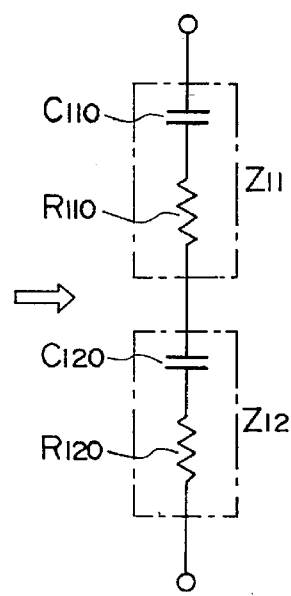
FIG. 23B is a circuit diagram showing a conversion of the basic arrangement of FIG. 23A.

FIG. 23A shows a basic arrangement of the compensation circuit C.C.. In FIG. 23A, Z11 is a high temperature range compensation circuit and Z12 is a low temperature range compensation circuit. Each of these compensation circuits Z11 and Z12 has a thermistor (TH1 or TH2) having a resistance varying with temperature, a fixed capacitor (C11 or C12), and a correcting resistor (R11 or R13) for the thermistor. By parallel to serial conversion, circuits values in a circuit of FIG. 23B are;

$$C110 = C11\{1 + (\omega C11(R10 + R11))^{-2}\} \quad (2\text{-}14)$$
$$R110 = (R10 + R11)\{1 + (\omega C11(R10 + R11))^2\}^{-1}$$
$$C120 = C12\left\{1 + \left(\omega C12\left(\frac{R12 \cdot R13}{R12 + R13}\right)\right)^2\right\}^{-1}$$
$$R120 = \frac{R12 \cdot R13}{R12 + R13}\left\{1 + \left(\omega C12\left(\frac{R12 \cdot R13}{R12 + R13}\right)\right)^2\right\}^{-1}$$

Figure 23C:
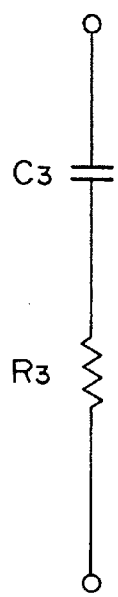
FIG. 23C is a circuit diagram showing a final conversion.

Circuit values of FIG. 23C are;

$C3=C110 \times C120/(C110+C120)$ $R3=R110+R120 \quad (2\text{-}15)$

By using resistance values R10'0 and R12'0 of the thermistors TH1 and TH2 at a reference temperature T0 (298.15 K., for example), the resistances R10 and R12 of the thermistors TH1 and TH2 are expressed as;

$$R10 = R_{10'0}\exp\left\{B10\left(\frac{1}{T} - \frac{1}{T0}\right)\right\} \quad (2\text{-}16)$$
$$R12 = R_{12'0}\exp\left\{B12\left(\frac{1}{T} - \frac{1}{T0}\right)\right\}$$

In these equations, B10 and B12 are constants.

Figure 24:
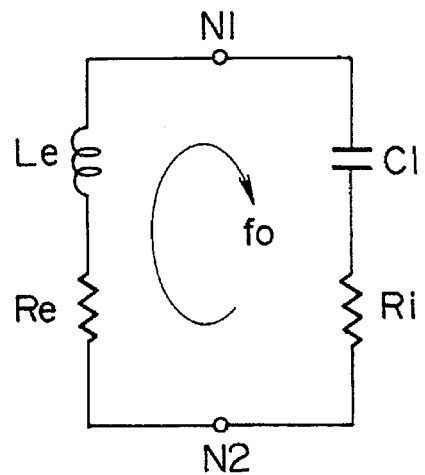
FIG. 24 is a circuit diagram schematically showing an arrangement to determine an oscillation frequency f0.

The frequency of oscillation f0 in the circuit of FIG. 22 is determined by using a circuit shown in FIG. 24. In this figure, Le and Re are effective inductance and effective resistance of the AT cut plate at f0, and Cl and Ri are load capacitance and negative resistance on the circuit's side.

By using the following equation (2-17) regarding Cl;

$C_{l0}=CA \cdot CB/(CA+CB) \quad (2\text{-}17)$ we can obtain the following equation (2-18);

$$\frac{1}{Cl} = \frac{1}{\alpha \cdot C10} + \frac{1}{C3} \quad (2\text{-}18)$$

$$\alpha = 1 + \frac{\frac{CA}{CB} - gmRE}{\omega^2 CB(CA + CB)RE^2 + 1 + gmRE}$$

As to Ri, the following equation (2-19) holds;

$$Ri = -\frac{gm}{\omega^2 CACB}\left\{1 - \frac{1}{1 + (\omega CBRE)^2}\right\} + \frac{RE}{1 + (\omega CBRE)^2} + R3 \quad (2\text{-}19)$$

In deriving the equations (2-18) and (2-19), only the mutual conductance gm of the transistor (Tr) is involved, assuming that the base-emitter capacitance is sufficiently smaller than CA or included in CA, the base-collector capacitance is sufficiently smaller than C10 in the equation (2-17), and the base resistance is negligible. Furthermore, RA and RB determining the DC potential of the base are omitted under the assumption that RA and RB are chosen, as the admittance of the parallel connection, to be sufficiently smaller than the admittance between N1 and N3 in FIG. 22.

The mutual conductance $g_m$ in the equation (2-19) is greater in a start up operation of oscillation (in which the amplitude is small) and decreases as the amplitude increases. Namely, the oscillation starts when:

$|Ri|>Re \quad (2\text{-}20)$

A steady state condition is reached when:

$|Ri|=Re \quad (2\text{-}21)$ where Re is in equation (2-24).

From FIG. 24, the angular frequency $\omega_0$ corresponding to the oscillation frequency $f_0$ is given by;

$\omega_0^2 = 1/(Le \cdot C_l) \quad (2\text{-}22)$

In this equation, Cl becomes equal to the value of the equation (2-18) determined by $g_m$ in the steady state condition of (2-21).

An equivalent circuit of the AT cut plate is expressed by the following parameters.

Parallel capacitance: C0

Series arm capacitance: C0/γ (γ, capacitance ratio)

Series resistance: R1

Series resonance frequency; Fs

Since the AT cut plate is small in electromechanical coupling coefficient, that is γ is great (200~300), and Q is high (R1<<γ/ωsC0), f0 is approximately given, from the equation (2-22), by;

$$f0 = fs\left\{1 + \frac{1}{2\gamma\left(1 + \frac{Cl}{C0}\right)}\right\} \quad (2\text{-}23)$$

Re takes the following value at f0;

$Re=R1(1+C0/Cl)^2 \quad (2\text{-}24)$

Thus, the equations (2-24), (2-21), (2-19), (2-23) and (2-18) hold simultaneously, and the amplitude and oscillation frequency f0 corresponding to gm are determined.

The following is one example.

Constants of AT cut;

$f_s = 10$ MHz $C_0 = 2$pF $\gamma = 300$ $R_1 = 15\Omega$

Circuit constants;

| | | |
|---|---|---|
| $CA = 50$ pF | $C11 = 40$ pF | $R10 = 3,000 \Omega$ (25° C.) |
| $CB = 100$ pF | $C12 = 40$ pF | $B10 = 4,000$ |
| $RE = 470 \Omega$ | | $R12 = 50 \Omega$ (25° C.) |
| | | $B12 = 2,500$ |
| | | $R11 = 200 \Omega$ |
| | | $R13 = 1,000 \Omega$ |

In this example, the equations (2-14), (2-15), (2-16), (2-17), (2-18), (2-19), (2-21), (2-23) and (2-24) give the following results.

Low temperature compensation;

+14.8 ppm at −20° C., +7.1 ppm at −5° C.

High temperature compensation;

−4.1 ppm at 55° C., −10.7 ppm at 70° C.

Figure 25:
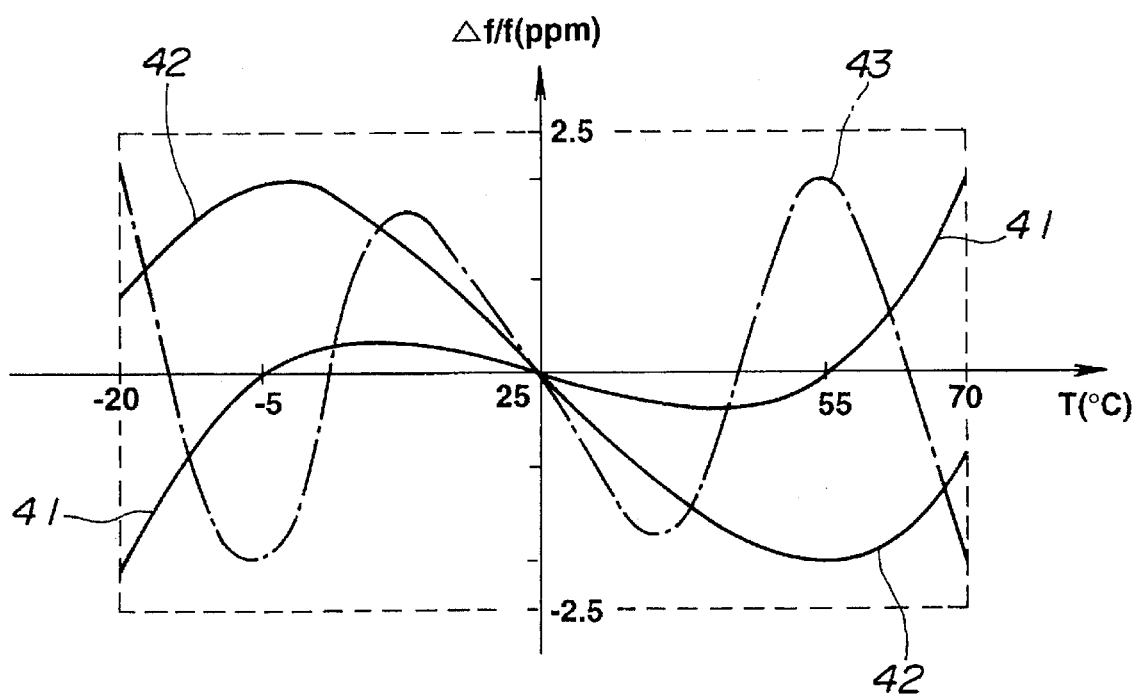
FIG. 25 is a graph showing temperature-frequency variation characteristics of TCXO.

Accordingly, cubic curves 41 and 42 shown in FIG. 25 are obtained by using the AT cut plate having the temperature characteristic of FIG. 19.

Furthermore, the compensation circuits Z11 and Z12 with appropriately determined device values can provide compensation to the AT cut plate of low $y_m$ (1 ppm, for example) as shown in FIG. 20. In this case, the characteristic can become a curve of fifth order as shown by 43 in FIG. 25.

In this way, the TCXO can satisfy the requirement (2-1). The TCXO has the following drawbacks and problems, however.

(1) The deviation angle of the normal line of the AT cut plate must be within a very narrow allowable range, so that the production yield is poor, and the production cost is high.

In the case of the combination of the AT cut plate and the circuit of constants in the above-mentioned example, the allowable angle range of the normal line of the major surface of the AT cut plate is about ±0.3' or less, as suggested by the equation (2-19), in order to meet the requirement (2-1). In the existing state of technique, AT cut plates are produced through crystal cutting, polishing and etching, and the production process must further include an operation to select only acceptable products within ±0.3'. Therefore, the production efficiency is low and the production cost is high.

(2) Both of the high temperature and low temperature compensation circuits must be corrected about those circuit constants, so that the production process becomes long, and the TCXO size tends to increase for changing process.

Even if the AT cut plate is satisfactory, the amount of temperature compensation is greatly affected by variations of various characteristics such as $g_m$ of a transistor, and deviations of from desired values of capacitors (CA, CB, C11, C12), resistors (Re, R11, R13) and thermistors (R10, B10, R12, B12). Therefore, the resistors and capacitors (and the thermistors in some cases) must be changed to correct the circuit constants by replacement. If, for example, the high temperature range compensation is insufficient, the resistor R11 is changed to a smaller resistance, and moreover the capacitor C11 is changed to obtain a smaller value. If, on the other hand, the low temperature compensation is insufficient, the resistor R13 is changed to a greater value.

These circuit components of the small sized TCXO are SMDs (surface mounted devices). Therefore, the process to change components requires an operation to remove solder and an operation for soldering again. To achieve these operations, each component must have a surrounding area to enable the operations, so that the size of TCXO is increased. These operations to change circuit components increases the production cost of TCXO and reduces the advantage of the automatic production equipment.

(3) The Q of the compensation circuit is low, and a transistor of high $g_m$ is required. Accordingly, the cost becomes higher, and the short time frequency stability is low (jitter is high). Furthermore, the amplitude of the output voltage tends to vary.

The high temperature compensation circuit using a thermistor has a high equivalent resistance, and low Q. In the above-mentioned example, the values at 70° C. are;

$R3 = 185\Omega$ $Q = 1/\omega 0 C3 R3 = 1.6$ $Re = 18\Omega$ $Ri = -252\Omega$ $g_m = 5.5$mS That is, R3 is high and Q is low.

In the example without the compensation circuit, the values obtained from the equations (2-21) and (2-19) are;

$Ri = -65\Omega$ $g_m = 1.4$ mS

The addition of the compensation circuit increases Ri and $g_m$ about four times.

This comparison is between the values in the steady state condition. During an oscillation start up operation, the oscillator system requires a sufficiently large value of |−Ri| as known from the equation (2-20). To avoid a failure in the starting operation, the quantity |−Ri| is empirically required to be 10 times as much as the steady state value. The oscillator further requires a costly transistor having a high $g_m$.

As known in the art, the short term frequency stability called jitter is dependent on the circuit Q in the above-mentioned example in which the crystal unit Q is as high as 160,000. As Ri increases, the jitter increases, and the short term frequency stability becomes low. Therefore, this system is not suitable to the mobile communication system.

In the above-mentioned example, the required steady state $g_m$ is 3.6 mS at 25° C. As mentioned above, $g_m$ is 5.5 mS at 75° C. This difference is related to variation in the oscillation frequency and the amplitude of output voltage. As to the frequency, the value of 3.6 mS at 70° C. enables compensation of −12.8 ppm. However, if the system becomes stable at 5.5 mS, the value becomes equal to −10.7 ppm as mentioned before. The difference of −2.1 ppm is a decrease in the compensation sensitivity. This decrease is predictable, and this point can be covered by design of the circuit constants.

On the other hand, the amplitude variation varies widely in accordance with an input signal characteristic of $g_m$ of each transistor, and it is difficult to satisfy the requirement for a constant amplitude in the mobile communication system. A buffer is provided at the output terminal of FIG. 22 according to the need. This increases the size and cost of the system.

(4) The compensation of small variation in a wide temperature range is limited.

To obtain a TCXO which satisfies the requirement (2-2), a system of one example adds further stages of compensation circuits Z13, Z14, ... to the compensation circuits Z11 and Z12. This system, however, increases the number of component parts, the number of adjusting operations, and the size and cost of the system.

DTCXO can satisfy the requirement (2-2), but has some problems, as explained below.

Figure 26:
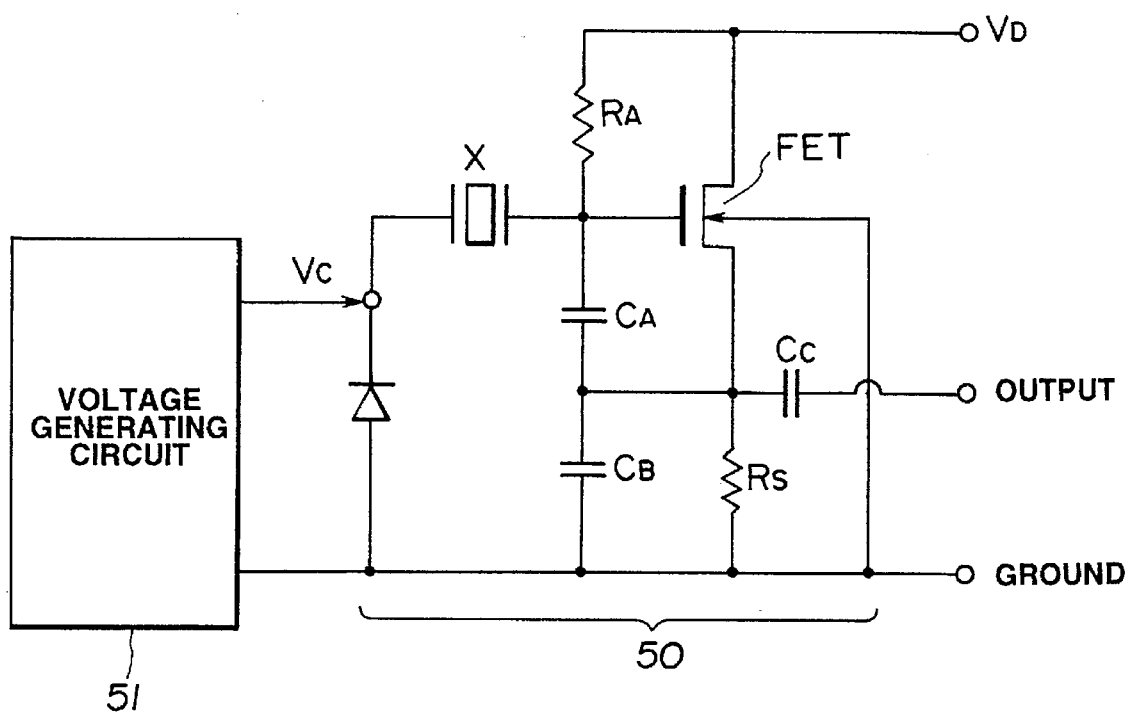
FIG. 26 is a circuit diagram showing a DTCXO.

FIG. 26 is a circuit diagram of a DTCXO. The circuit shown in FIG. 26 has a main circuit (VCXO) 50 (as mentioned before) and a voltage generating circuit 51. When the digital output of the AD converting section is 10 bits long, and the compensation data is 10 bits long, then the oscillator system can perform the compensation control satisfying the requirement (2-2) at intervals of 0.1° C., of a level of 0.1 ppm or less.

However, the DTCXO is still technically problematical in integration into a small one chip configuration to reduce the size and cost. In particular, the main circuit 50 is an analog circuit, and the voltage generating circuit 51 is a combination of analog and digital circuits. The improvement in techniques for reducing undesired mutual interference, for compressing the compensation data to reduce the required memory and for mounting one or more varicaps to increase the compensation width is now in progress. However, there still remains the problem of limitation to the compensation width due to an increase of an unwanted parasitic capacitance relating to the circuit configuration and layout to reduce the area. In comparison to the AT cut plate for TCXO requiring an allowable deviation angle within about ±0.3', the AT cut plate for DTCXO encounters a problem of how the allowable range can be increased. When compared by using the above-mentioned examples, the cost of DTCXO can be decreased significantly if the range can be increased about five times to ±1.5', or the allowable range is increased twice.

Therefore, a second embodiment of the present invention is devised to provide a temperature compensated crystal oscillator system which is low in size and cost.

Figure 10:
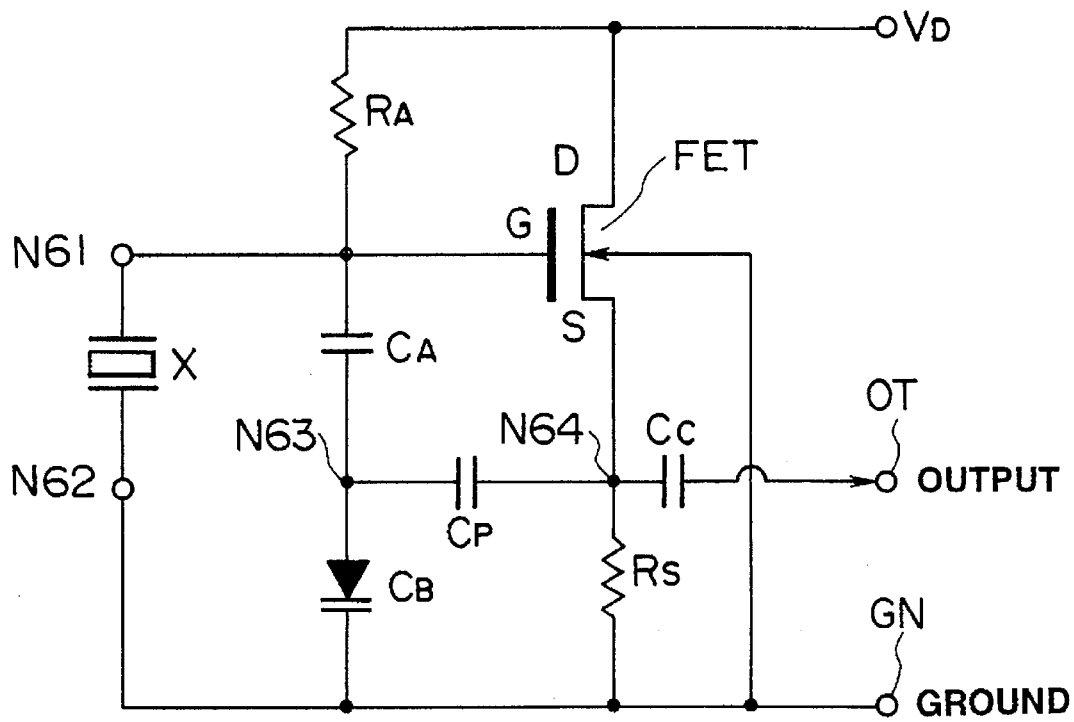
FIG. 10 is a circuit diagram showing a fifth practical example.

A fifth practical example according to the second embodiment of the present invention is shown in FIG. 10. FIG. 10 shows an AT cut plate crystal unit X and a one chip Colpitts oscillator circuit. The circuit shown in FIG. 10 has a field effect transistor FET and a gate voltage fixing resistor RA connected between the drain D and first gate G of the field effect transistor FET. The resistor RA of this example is a polysilicon resistor. A crystal unit X is connected between the first gate G and the ground or earth (i.e., between nodes N61 and N62). A series circuit of a capacitor CA of silicon nitride (SiN) and a feedback capacitor CB of a varicap is connected in parallel to the crystal unit X. In this example, the feedback capacitor CB is a transistor type capacitor. The oscillating circuit of FIG. 10 further includes a source resistor Rs between the source S of the transistor FET and the ground, and a decoupling capacitor Cp connected between a node N63 between the capacitors CA and CB and a node N64 between the source S and the source resistor Rs. The source resistor Rs in this example is a polysilicon resistor. There are further provided an output terminal OT connected through a capacitor Cc to the node N64, a power supply terminal VD connected to the drain of the transistor FET, and a grounding terminal GN. A second gate of the transistor FET is grounded.

The circuit of the example show in FIG. 10 has the following features at least.

First, the feedback capacitor CB is the transistor type capacitor having a temperature coefficient which is positive and great, and the cathode side of this capacitor CB is connected to the ground through the grounding terminal GN.

Second, the decoupling capacitor Cp is provided so as to prevent a DC voltage drop across the source resistor Rs from being applied to the feedback capacitor CB. Cp is $\beta_1$ times as much as CB.

Third, each of the capacitors CA and Cp is a capacitor, such as a silicon nitride ($Si_3N_4$) capacitor, having a plus temperature coefficient, the terminal on the substrate side of the capacitor CA is connected to the node N63 and the terminal on the substrate side of the capacitor Cp is connected to the node N64.

Fourth, the gate voltage fixing resistor RA and the source resistor Rs are polysilicon resistors. The terminal on the substrate side of the resistor RA is connected to the supply terminal VD, and the terminal on the substrate side of the resistor Rs is connected to the ground terminal GN.

In this example, the transistor FET is an N-MOS field effect transistor. However, it is possible to employ a P-MOS as the FET. A capacitor for varying the frequency may be injected or connected to the node N62.

The thus-arranged oscillator circuit can provide a one chip oscillator circuit which is small in required area and low in production cost.

Figure 11:
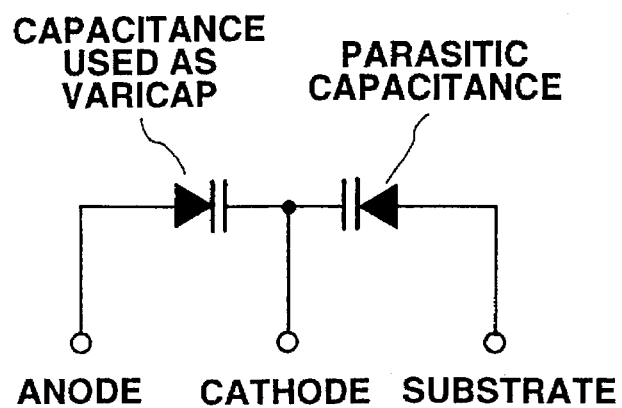
FIG. 11 is a view for illustrating operation of the fifth practical example.

FIG. 11 illustrates the example in which the cathode side of the feedback capacitor CB is connected to the ground terminal GN. This arrangement prevents a decrease of the plus temperature coefficient by using only the capacitance of the varicap and short-circuiting a parasitic capacitance.

The capacitor CB varies the capacitance by voltage application. Since this example does not use this function, the decoupling capacitance of Cp is inserted to avoid the influence of the DC voltage drop across the source resistor Rs. The decoupling capacitor Cp utilizes silicon nitride, for example, as dielectric material and has a capacitance of a positive temperature coefficient, and its capacitance is chosen as:

$$Cp = \beta_1 \cdot CB \quad (2\text{-}25)$$

where $\beta_1$ is in a range of 1~10.

The substrate side terminal of Cp is connected with the node N64 in order to connect a substrate side parasitic capacitance of Cp in parallel to Rs, instead of inserting the parasitic capacitance in parallel to CB.

The capacitors CA, CB, C11 and C12 in the conventional circuit shown in FIGS. 22 and 23A are small SMD ceramic type capacitors, and the temperature coefficient is approximately equal to zero, so that it is difficult to obtain +30 ppm/°C. or more.

The silicon nitride capacitors CA and Cp employed in the fifth example of the present invention can provide a temperature coefficient of +100 ppm/°C. or more by extracting the parasitic capacitance, that is, by the above-mentioned connection of the substrate side.

The transistor type capacitor (or junction capacitor) is a capacitor using a depletion layer, and including collector and emitter used as an anode, and a base used as a cathode. The capacitance varies in dependence on the applied voltage, so that this capacitor is called a variable capacitor.

The temperature coefficient of this capacitor is very high, and it is possible to obtain +2,000 ppm/°C. or more. The characteristic is dependent on frequency, and this is a value at 10 MHz.

The capacitance of Cp for decoupling CB from a DC voltage at the node N64. is sufficiently greater than CB in general, and β1 in the equation (2-25) is equal to or greater than 10. In the fifth example of the present invention, however, β1 is equal to or smaller than 10 and in the range of 1~10 for the following reason. The parasitic capacitance of Cp amounts to at least 5%, and, if increased, deteriorates the resistance characteristic of the impedance between the source of the transistor and the ground. Furthermore, the parasitic capacitance of 0.05 Cp is not directly connected in parallel to CB, but inserted through Cp so that the temperature coefficient of CB is not decreased equivalently.

The substrate side terminal of the capacitor CA is connected to the node N63 for the following reason. A parasitic capacitance of the substrate side terminal of CA must be estimated to be 20% of CA. If the substrate side terminal is connected to the node N61, the capacitance of 0.2 CA is inserted between the nodes N61 and N62. Such a capacitance connected in parallel to a parallel capacitance C0 of the AT cut plate significantly deteriorates the sensitivity of frequency variation by a load capacitance C1 and hence sharply decreases the capability of frequency temperature compensation using the temperature coefficient of CB.

When the substrate side terminal of CA is connected to the node N63, the capacitance of 0.2 CA is in parallel to CB. The temperature coefficient of CB is decreased by about 0.2 CA/CB, but it can be made up for by a choice of the temperature coefficient of CB.

As the resistors RA and Rs, the fifth example employs the polysilicon resistor having a smaller parasitic capacitance, instead of a diffused resistor. With this feature, the oscillating circuit can prevent a decrease of the frequency compensation capability by the temperature coefficient of CB due to a parasitic capacitance inserted between the nodes N61 and N62 and between the nodes N64 and N62.

The capacitor CB having a great positive temperature coefficient can perform the temperature compensation in the following manner. The following equations (2-26) are for determining equations corresponding to the load capacitance equation (2-18) and the load resistance equation (2-19) of the conventional system shown in FIG. 22.

$$ZI = (Z1 + Z2 + g_m Z1 \cdot Z2) + Z3 \tag{2-26}$$

$$Z1 = \frac{1}{j\omega CA}$$

$$Z2 = \frac{1}{\frac{1}{RE} + j\omega CA}$$

$$Z3 = R3 + \frac{1}{j\omega CA}$$

$$Cl = Im(ZI)$$
$$Ri = Re(ZI)$$

Similarly, in the circuit of FIG. 10, the impedance Z1 as viewed in the rightward direction from between the nodes N61 and N62 is given by the following equations (2-27), (2-28) and (2-29).

$$Zl1 = \left\{ Z1 + \frac{(Z4+Z5) \cdot Z6}{(Z4+Z5)+Z6} \right\} \cdot \beta_{10} + g_m \cdot \tag{2-27}$$

$$\left\{ Z1 + \left(1 + \frac{Z1}{Z6}\right) Z5 \right\} \cdot \frac{(Z4+Z5) \cdot Z6}{(Z4+Z5)+Z6} \right\} \cdot \beta_{11}$$

$$\frac{1}{\beta_{10}} = 1 + gm \cdot Z5 \cdot \frac{FN}{FD}$$

where $FN = \left(1 + \frac{Z1}{Z6}\right) - \frac{Z6}{Z4+Z5+Z6}$ $$FD = \left(1 + \frac{Z1}{Z6}\right) + \left\{ Z1 + \left(1 + \frac{Z1}{Z6}\right) Z5 \right\} \frac{1}{Z4}$$

$$\beta_{11} = \left(1 + \frac{Z1(Z4+Z5+Z6)}{Z6(Z4+Z5)}\right) /$$

$$\left\{ 1 + \frac{Z1}{Z6} + \left[Z1 + \left(1 + \frac{Z1}{Z6}\right) Z5\right] \frac{1}{Z4} + \right.$$

$$\left. g_m \cdot Z5 \cdot \left(1 + \frac{Z1}{Z6} - \frac{Z6}{Z4+Z5+Z6}\right) \right\}$$

$$Z1 = \frac{1}{j\omega CA} \tag{2-28}$$

$$Z4 = \frac{1}{\frac{1}{Rs} + j\omega Cp\beta2}$$

$$= \frac{Rs}{1+(\omega Cp\beta2 Rs)^2} + \frac{1}{j\omega Cp\beta2} \cdot \frac{1}{\{1+(\omega Cp\beta2 Rs)^{-2}\}}$$

$$Z5 = \frac{1}{j\omega Cp} \left( = \frac{1}{j\omega CB\beta1} \right)$$

$$Z6 = \frac{1}{j\omega CB}$$

$$Cl = Im(Zl1) \tag{2-29}$$
$$Ri = Re(Zl1)$$

In deriving the equation (2-27), as in the equation (2-26), only the mutual conductance $g_m$ is involved, and other parameters are neglected. For example, the capacitance between the gate and source is contained in $C_A$, the capacitance between the gate and drain is so small and negligible, and the admittance of $R_A$ is sufficiently smaller than the admittance of Z1 so that it is also negligible. In the equation (2-28), β2 is a parasitic capacitance ratio of Cp, and equal to 0.05, for example.

The configuration is changed from FIG. 22 to FIG. 10 by omitting Z3, and dividing $Z_2$ into $Z_4$ and $Z_6$ across $Z_5$. Therefore, if Cp→∞, Z5=0, $\beta_{10}$=1, and $\beta_{11}$=1. The equation (2-27) becomes equal to Z3 in the first equation of (2-26). In this case, Z2 is given by:

$$Z4 \cdot Z6/(Z4+Z6)=Z2 \tag{2-30}$$

The right members of the equations (2-29) corresponding to the equations (2-18) and (2-19) are derived algebraically. In the above expression, these are simplified.

If the circuit constants are chosen normally, concerning gm as in the equations (2-18) and (2-19), the influence on Ri is strong, and the influence on Cl is very small. As to β, the following relationships (2-31) are obtained;

$$Re(\beta11) \to 1$$

$$Im(\beta11) \to 0$$

$$Re(\beta12) \to 1$$

$$Im(\beta12) \to 0 \tag{2-31}$$

Therefore, it is presumed from the equation (2-27) that, when CB increases, Z6 decreases, and Im(Zl1) decreases. Im(Zl1) is called a load capacitance Cl, and a decrease of the former means an increase of the latter. The ability of relative frequency compensation represents how the frequency f0 of oscillation varies with changes in Cl. The following equation is obtained by using $f_{o1}$ in the case of Cl1, and $f_{o2}$ in the case of Cl2 in the equation (2-23);

$$y = A\left(\frac{Cl10}{Cl20} - 1\right) \qquad (2\text{-}32)$$

$$y = \frac{f02 - f01}{f01}$$

$$A = \left(2\gamma\frac{Cl10}{C0} + 1\right)^{-1}$$

$$Cl10 = Cl1 + C0$$
$$Cl20 = Cl2 + C0$$

In the equation (2-32), A is a frequency variation sensitivity at the load capacitance Cl1, which is determined by $\gamma$ and C0 of the AT cut plate, and y is a variation of relative frequency when the load capacitance changes from Cl1 to Cl2.

The following is one concrete example implementing the frequency compensation.

As to the AT cut plate as in the preceding example;

fs=10 MHz, C0=2pF, $\gamma$=300 and R1=15Ω.

The circuit constants of the circuit shown in FIG. 10 are;

| | |
|---|---|
| CA = 40 pF | ;temperature coefficient + 100 ppm/°C. |
| CB = 40 pF | ;temperature coefficient + 2,000 ppm/°C. |
| CP = 100 pF(∴β1 = 2.5) | ;temperature coefficient + 100 ppm/°C. |
| CPβ2 = 5 pF(∴β2 = 0.05) | ;temperature coefficient + 0 ppm/°C. |
| Rs = 10 KΩ | |

From the equations (2-27)–(2-29), the conditions for oscillation at 5° C. are; Cl1=21.07 pF, $R_{i1}$=–18Ω and $g_{m1}$=0.21 mS. The oscillating conditions at 70° C. are; Cl2=21.99 pF, $R_{i2}$=–18 Ω and $g_{m2}$=0.22 mS. The conditions at –20° C. are; Cl3=20.09 pF, $R_{i3}$=–18Ω and $g_{m3}$=0.20 mS. From the equation (2-32), the relative frequency compensation at 70° C. is –5.5 ppm and the relative frequency compensation at –20° C. is +6.4 ppm.

The result of measurement of a two-terminal impedance between the nodes N61 and N62 in the circuit of FIG. 10 assembled in consideration of the above-mentioned factors indicates that Clj and Rij (j=1, 2, 3) show values close to those. The capability of frequency compensation was confirmed by using the combination of the assembled circuit and the AT cut plate. That is, the relationship (2-1) can be accomplished by selecting the AT cut plate corresponding to this constant, and the curve 42 of third order shown in FIG. 25 can be obtained.

In the fifth practical example shown in FIG. 10, the substrate side terminal of the capacitor CA is connected to the node N63, and separated from the node N61. In the case of connection with the node N61, the parasitic capacitance 0.2 CA of the capacitor CA amounts to 8 pF in the above-mentioned concrete example, and this parasitic capacitance is inserted in parallel to C0 (parallel capacitance of the AT plate). The equation (2-32) is rewritten as:

$$y = A\left(\frac{Cl10}{Cl20} - 1\right) \qquad (2\text{-}33)$$

$$A = \left(2\gamma\frac{Cl10}{C0} + 1\right)^{-1}$$

$$Cl10 = Cl1 + C0 + 0.2CA$$
$$Cl20 = Cl2 + C0 + 0.2CA$$

In this case, the relative frequency compensation according to the above-mentioned example becomes equal to –4.2 ppm at 70° C., and the relative frequency compensation at –20° C. lowers to 4.7 ppm. The connection with the node N63 can avoid this disadvantage.

Figure 12:
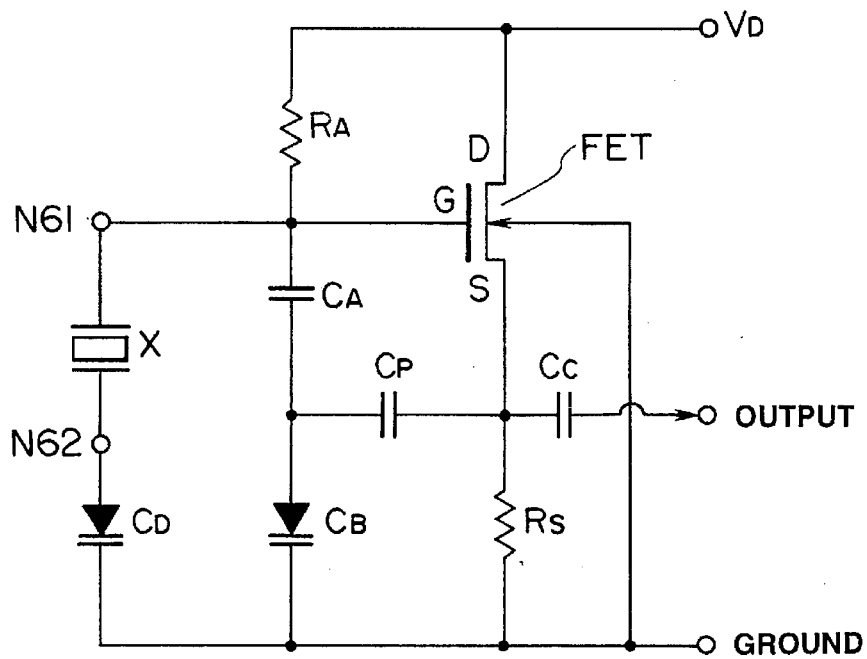
FIG. 12 is a circuit diagram showing a sixth practical example of the present invention.

A sixth practical example according to the second embodiment of the present invention is shown in FIG. 12. The circuit shown in FIG. 12 has a transistor type capacitor CD connected between the node N62 and the ground in addition to the components shown in FIG. 10. As explained in the explanation of the fifth example, the cathode side is connected to the ground, a parasitic capacitor is short-circuited, and the capacitor is arranged to prevent a decrease of its positive temperature coefficient.

In the sixth practical example, in consideration of Q relating to CD, the equation to determine the frequency is obtained as follows.

$$Z7 = \frac{1}{j\omega CD}\left(1 + j\frac{1}{Q}\right) \qquad (2\text{-}34)$$

In this case;

$$Zl2 = Zl1 + Z7 \qquad (2\text{-}35)$$

We can obtain the following equations;

$$Cl = \text{Im}(Zl2)$$

$$Ri = \text{Re}(Zl2) \qquad (2\text{-}36)$$

In relation to Z6 in the equation (2-28) too, consideration should be given to Q of CB. However, it is optional to omit this factor. In the case of (2-34), this factor is added because Ri in the equation (2-36) is directly influenced.

The following is an concrete example for illustrating the operation of the sixth practical example. In this example, CD=40 pF, the temperature coefficient is +2,000 ppm/°C., Q=50, and the other constants are equal to those in the concrete example of the fifth practical example.

From the equations (2-34)–(2-36), the oscillating conditions at 25° C. are;

Cl1=13.80 pF

Ri1=–20Ω

$g_{m1}$=0.27 mS

At 70° C.;

Cl2=14.65 pF

Ri2=–19Ω

$g_{m2}$=0.26 mS

At –20° C.;

Cl3=12.82 pF

Ri3=–20Ω

$g_{m3}$=0.29 mS

From the equation (2-32), the relative frequency compensation at 70° C. is –10.8 ppm, and the relative frequency compensation at –20° C. is 13.9 ppm.

In this case, too, measurement of a right side two-terminal impedance between the nodes N61 and N62 in the circuit of FIG. 12 provides measured values close to the above-mentioned values. The combination with the AT plate (which in this case has a greater slope than that of the fifth practical example) results in an oscillator satisfying the requirement (2-1). The temperature characteristic is approximately in the form of a third order curve, and the characteristic of the AT plate shown in FIG. 20 becomes a curve of the type 41 or 42 shown in FIG. 25. Therefore, the compensation can be improved twice or more by using a transistor type capacitor having the same temperature coefficient of +2,000 ppm/°C.

In the case of a circuit according to the fifth practical example employing a transistor type capacitor having a temperature coefficient of +4,000 ppm/°C., the result is −9 ppm at 70° C., and +12 ppm at −20° C. The compensating ability is lower, than that of the sixth practical example.

Figure 13:
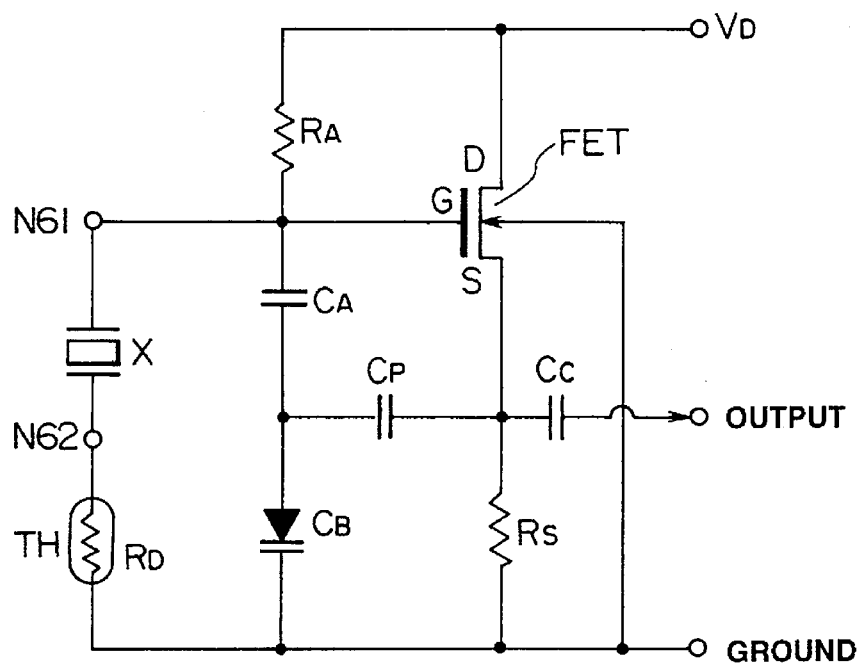
FIG. 13 is a circuit diagram showing a seventh practical example of the present invention.

A seventh practical example according to the second embodiment of the present invention is shown in FIG. 13. The circuit shown in FIG. 13 has a thermistor TH connected between the node N62 and the ground. The resistance of the thermistor TH varies in accordance with the temperature.

Figure 14:
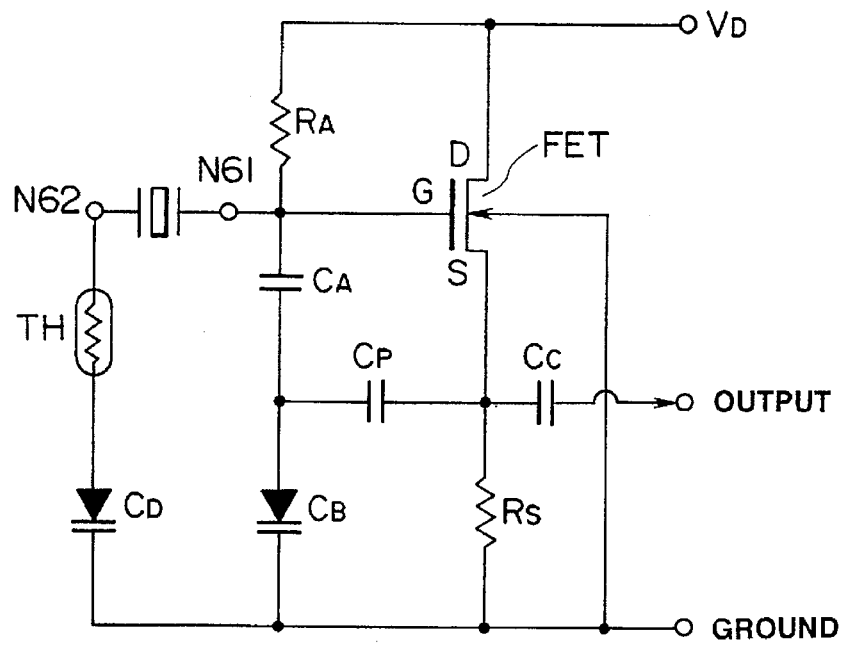
FIG. 14 is a circuit diagram showing an eighth practical example of the present invention.

An eighth practical example according to the second embodiment of the present invention is shown in FIG. 14. The circuit shown in FIG. 14 has a thermistor TH connected between the node 62 shown in FIG. 12 and the anode side of the capacitor CD shown in FIG. 12.

The following is an explanation common to the seventh and eight practical examples.

The seventh impedance Z7 shown in the sixth practical example is given by;

$$Z7 = \frac{1}{j\omega CD}\left(1 + j\frac{1}{Q}\right) \quad (2\text{-}37)$$

$$= \frac{1}{j\omega CD} + RD$$

$$RD = \frac{1}{\omega CDQ}$$

In the seventh practical example of FIG. 13, CD in the equation (2-37) is infinite (CD→∞), and RD is the resistance (RT) of the thermistor. In the eighth example of FIG. 14, CD is the capacitance of the transistor type capacitor, and RD is a sum of the resistance of the transistor type capacitor plus the thermistor resistance (RT).

The resistance (RT) of the thermistor TH is;

$$RT = RT0 \exp\left\{BT\left(\frac{1}{T} - \frac{1}{T0}\right)\right\} \quad (2\text{-}38)$$

In this equation, RT0 is a resistance value at a standard temperature T0 (298.15 K., for example). RT is a resistance value at a temperature T (K.), and BT is a constant. The resistance increases as the temperature decreases.

From the equations (2-36), (2-27) and (2-28), gm is required to be greater when RD increases. With increase in gm, the load capacitance Cl decreases, and the oscillation frequency is made higher (the compensating operation is increased).

In one concrete example, the AT cut plate and the circuit constants are the same as used in the fifth practical example of FIG. 10, and constants of the thermistor TH are;

RT0=10Ω

T0=4,000 Kelvin

In this case, RT is 108.6Ω at −20° C., 10.0Ω at 25° C. and 1.7Ω at 70° C.

At 25° C., the oscillating conditions determined from the equations (2-35)~(2-37), (2-27) and (2-28) are;

Cl1=21.05 pF $Ri=-18\Omega$ $g_m=0.3$ mS

At 70° C.;

Cl=21.97 pF $Ri=-18\Omega$ $g_m=0.22$ mS

At −20° C.;

Cl3=19.52 pF $Ri=-18\Omega$ $g_m=1.0$ mS

From the equation (2-32), the relative frequency compensation at 70° C. is −5.6 ppm, and the relative frequency compensation at −20° C. is 10.3 ppm. As compared with the fifth practical example of FIG. 10, the compensation at low temperatures is increased.

The equation (2-32) is a hyperbola with respect to Cl20=Cl10, and y becomes greater when Cl20 decreases than when Cl20 increases. This tendency is further increased in this practical example. As mentioned before, the AT plate is large in frequency deviation in the minus direction of the temperature, and hence desirable influence is exerted. The temperature characteristic after compensation is in the form of a quasi three-order curve close to the curve 41 or 42 shown in FIG. 25.

Figure 15:
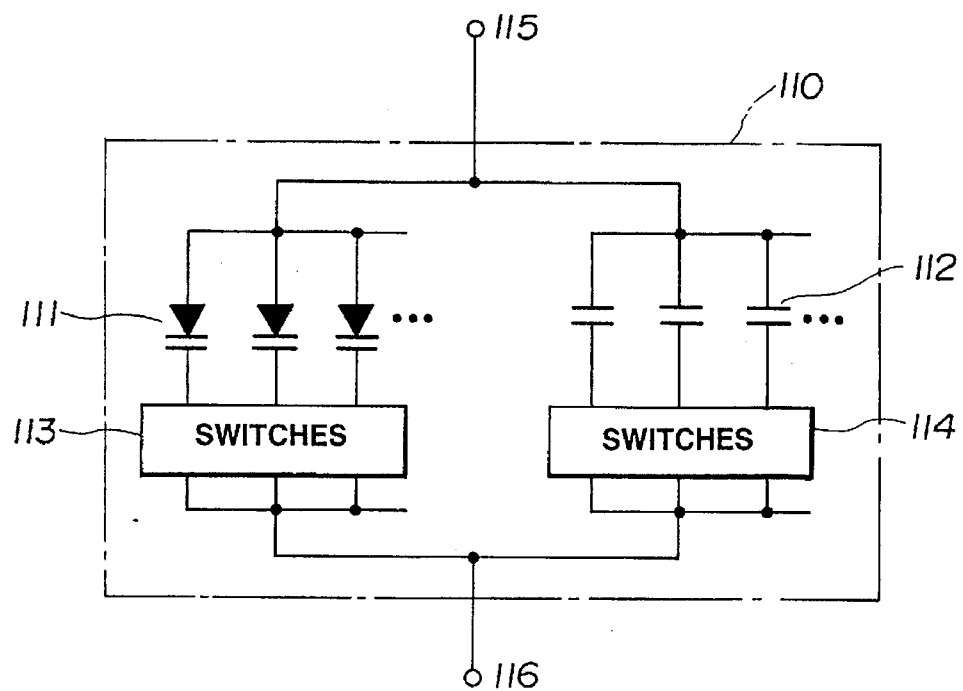
FIG. 15 is a circuit diagram showing a ninth practical example of the present invention.

A ninth practical example according to the second embodiment of the present invention is shown in FIG. 15. In the fifth to eighth practical examples, the circuit is devised for temperature compensation for the AT cut plate, and the characteristic of the AT cut plate is chosen when the circuit is determined. In the ninth practical example, the circuit is adapted when the characteristic of the AT cut plate is determined.

In FIG. 15, a reference numeral 110 represents one of the capacitors CB and CD shown in FIGS. 10, 12, 13 and 14. The component 110 shown in FIG. 15 has a first parallel circuit 111 and a second parallel circuit 112. The first parallel circuit 111 is a parallel combination of reference cells of transistor type capacitors, or a parallel combination of cells having weighted capacitances of $2^n$. The second parallel circuit 112 is a parallel combination of reference cells of capacitors, such as silicon nitride capacitors, having a temperature coefficient lower than that of the first parallel circuit 111, or a parallel combination of capacitor cells having weights of $2^n$.

The component 110 further includes a first switch group 113 for selecting each capacitor of the first parallel circuit 111, and a second switch group 114 for selecting each capacitor of the second parallel circuit 112. The switches are devices of a hardware ground configuration, or semiconductor switches through memory and driver (a kind of software grounding). In FIG. 15, the switches are disposed near the terminal 116. However, it is possible to provide the switches on the part of the terminal 115 in consideration of the efficiency of the on/off switching operations.

It is possible to achieve the required temperature coefficient of CB or CD by combining semiconductor switches 113 and 114. The required temperature coefficients can be determined by determining a required variation of the load capacitance in the equation (2-32) from relative frequency compensation quantities required for compensation of the AT cut plate at an upper limit (70° C., for example) and a lower limit (–20° C., for example), and by calculating backward the equations (2-27)~(2-29) and (2-34)~(2-36).

In each of the concrete examples of the fifth, sixth and seventh practical examples, the following relationship holds;

$$\frac{\partial Cl}{Cl} = k\frac{\partial CB}{CB} \quad (2\text{-}39)$$

The rate of the load capacitance change approximately indicates the magnitude of the compensating ability and is proportional to the temperature variation sensitivity of CB. In the equation (2-39), 1>k>0, and k=0.44 in the concrete example of the fifth practical example. When $\partial Cl/Cl$ in the equation (2-39) does not satisfy y of (2-32), it is optional to increase $\partial CB/CB$ (to increase the temperature coefficient of CB, that is).

Namely, it is possible to select more of the capacitors of the first parallel circuit 111 with the first switch group 113, and less of the capacitors of the second parallel circuit 112 with the second switch group 114. Such a selection is made according to design values determined by off-line simulation, or in a state in which the component 110 (in practice, incorporated in the entire circuit) in a required temperature environment (in an oven of 70° C., for example).

It is possible to arbitrarily select one of characteristics after compensation such as the curves 41 and 42 in FIG. 25. The configuration of the component 110 makes it possible to correct a deviation of an actual value from a design value.

Figure 16:
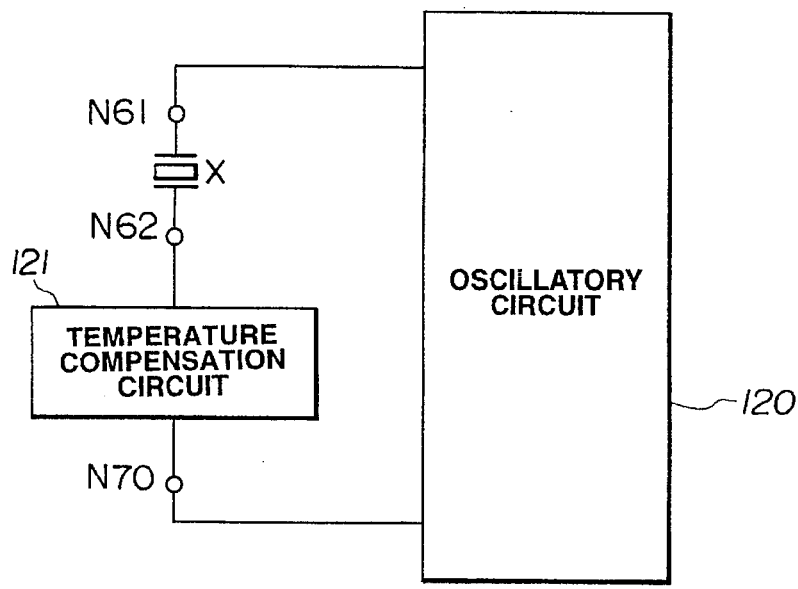
FIG. 16 is a circuit diagram showing a tenth practical example of the present invention.

A tenth practical example according to the second embodiment of the present invention is shown in FIG. 16. An oscillatory circuit 120 is one of the circuits shown in FIGS. 10, 12, 13, 14 and 15 excluding the AT cut plate. The circuit shown in FIG. 16 further includes a temperature compensation circuit 121 comprising a parallel series circuit of at least one thermistor having a resistance varying with temperature, and at least one fixed capacitor.

As explained before, the oscillatory circuit 120 alone can perform temperature compensation. The combination of the oscillatory circuit 120 and the temperature compensation circuit 121 can provide further compensating effect.

The seventh and eighth practical examples are superior in compensation in the low temperature range. The tenth practical example further enables high temperature compensation, and because of a secondary nature of the compensation, remedies the drawback of the conventional example significantly. As a characteristic after compensation, it is possible to select any of the curves 41~43 in FIG. 25.

Figure 17:
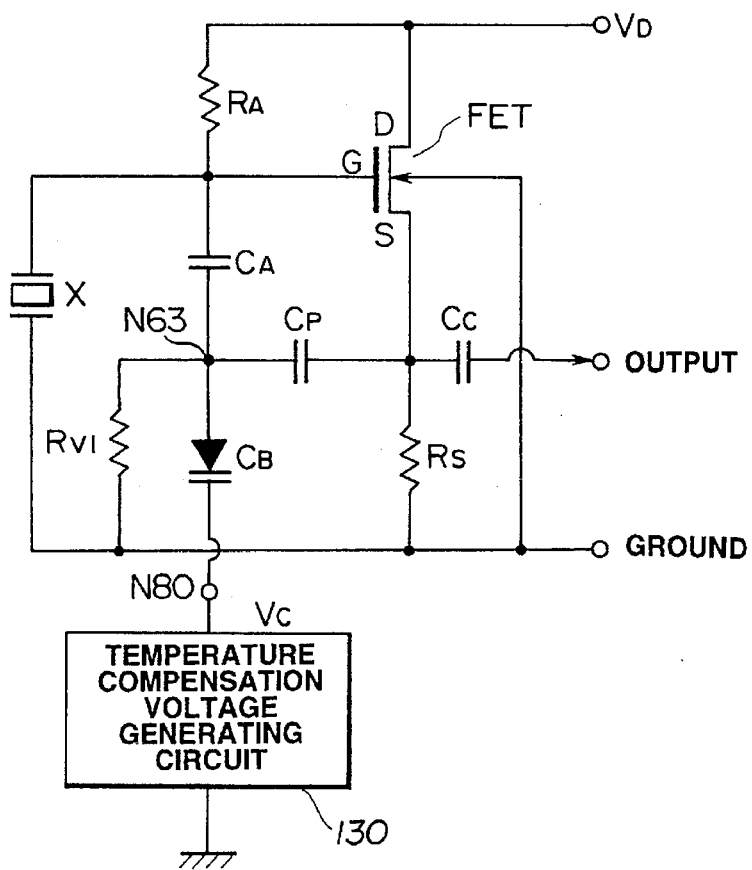
FIG. 17 is a circuit diagram showing an eleventh practical example of the present invention.
Figure 18:
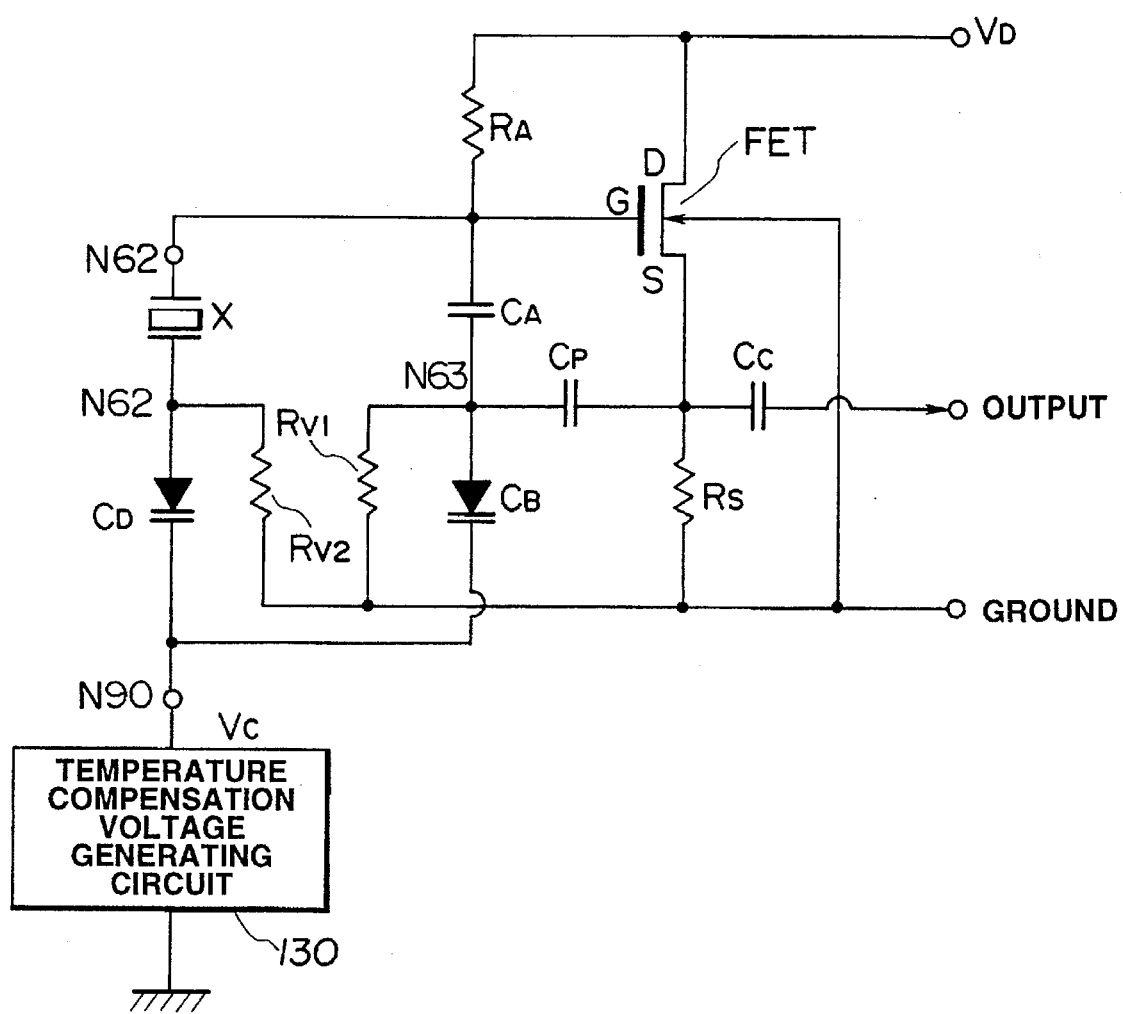
FIG. 18 is a circuit diagram showing a twelfth practical example of the present invention.

Eleventh and twelfth practical examples according to the second embodiment are shown, respectively, in FIGS. 17 and 18. Each of the circuits shown in FIGS. 17 and 18 has a temperature compensation voltage generating circuit 130 for generating a temperature compensation voltage Vc.

In the eleventh practical example shown in FIG. 17, the temperature compensation voltage Vc is applied to the varicap CB. The compensation voltage generating circuit 130 may be a system for producing the voltage Vc by reading out one of data stored in a ROM in accordance with a sensed temperature as an address input, or may be an analog circuit having a function generating means for generating an approximate voltage Vc corresponding to the temperature.

The eleventh practical example corresponds to the fifth practical example of FIG. 10. The output voltage from the voltage generating circuit 130 is applied to a node N80, and the varicap CB receives the voltage as a reverse bias voltage. A resistor RV1 (of 50 K.Ω, for example) is connected between the node N63 and the ground. With this arrangement, the capacitance of the varicap CB is varied in accordance with the compensation voltage Vc.

The twelfth practical example of FIG. 18 corresponds to the sixth practical example of FIG. 12. As shown in FIG. 18, the voltage of the generating circuit 130 is applied, through the node N90, as a reverse bias voltage, to each of the varicaps CB and CD. A resistor RV1 (50 K.Ω, for example) is connected between the node N63 and the ground, and another resistor RV2 (50 K.Ω, for example) is connected between the node N62 and the ground. The capacitances of the varicaps CB and CD vary in accordance with the compensation voltage Vc.

The function of the temperature compensation voltage generating circuit 130 is not heavy in contribution to the temperature compensation as in the tenth practical example. However, it is easy to simplify the configuration of the Vc generating circuit 130, so that this example can reduce the size of the whole circuit, power consumption and cost. This example employs a polysilicon resistor of a small parasitic capacitance as the resistors RV1 and RV2. The characteristic after compensation can be in the form of one of curves 41~43 shown in FIG. 25 in accordance with the relationship of the Vc voltage to the temperature. It is possible to obtain a desired polynomial curve. As an ultimate curve, it is further possible to obtain a straight line with no temperature dependency and no deviation.

A thirteenth practical example according to the second embodiment employs a discrete type oscillator circuit. The fifth to twelfth practical examples are suitable to one chip LSI configuration. However, the configuration of the discrete type oscillator circuit is sufficiently effective. In the thirteenth practical example, circuit components are mounted on a resin printed board or ceramic substrate, the capacitors CA and Cp are in the form of a widely used small SMD ceramic multilayer capacitor, the resistors Rs, RA, RV1 and RV2 are in the form of a small SMD resistor. The important point of the thirteenth practical example resides in that each of the capacitors CB and CD is a varicap having a great positive temperature coefficient. Furthermore, a parasitic capacitor is not involved regarding CA, Cp, Rs; RA, RV1 and RV2, it is not necessary to specify the direction of the terminal. Moreover, the restraint about the ratio β1 of CB and Cp is removed, so that the size reduction is possible.

As mentioned above, the fifth practical example can offer the following advantages.

(1) The feedback capacitor CB of the Colpitts oscillator circuit is the transistor type capacitor having the temperature coefficient which is positive and high. Therefore, the feedback capacitor Cb can serve as a means for temperature compensation, and the use of such a multi-functional device can reduce the size and cost of the system.

(2) With the connection of the cathode side of the feedback capacitor CB to the ground, a parasitic capacitor is short circuited, and the oscillator system can effectively utilize the positive and high temperature coefficient, and the temperature compensation becomes wider.

(3) The decoupling capacitor Cp is provided so as to prevent a DC voltage drop of the source resistance of the transistor of the Colpitts oscillator circuit from being applied to the feedback capacitor CB, and the capacitor ratio β1=Cp/CB is chosen in a range of 1~10. By the selection of a low value, this example prevents the resistance of the impedance between the source of the transistor and ground from being decreased, and the temperature coefficient of CB in effect from being decreased (4) The substrate side terminal of the detecting capacitor CA of the Colpitts oscillator circuit is connected to the part of CB, and its parasitic capacitor is removed from the input gate of the transistor. Therefore, a decrease of the frequency compensating ability is small.

(5) The resistor RA for fixing the gate voltage and the source resistor Rs are made of polysilicon, so that the parasitic capacitor is small and a decrease of the frequency compensating ability is small.

(6) The substrate side terminals of RA and Rs are connected to VD and ground. This arrangement reduces the parasitic capacitor and prevents the frequency compensating ability from being decreased.

(7) The mutual conductance $g_m$ is low in the comparison of the steady state condition. Therefore, the short time frequency stability is significantly improved (the jitter is small). The small $g_m$ contributes to the stability of the output voltage. The abovementioned features are all advantageous to the mobile communication system.

(8) A low value of $g_m$ widens the design tolerance of the transistor used in the system, and contributes to the cost reduction.

(9) A low value of $g_m$ makes unwanted oscillation difficult to occur, improves the yield, and contributes to the size reduction in this point too.

The varicap CD in series to the AT cut plate in the sixth practical example provides the following advantages in addition to the advantages of the fifth practical examples;

(1) The cathode side of the CD can be connected to the ground terminal. This arrangement short-circuits a parasitic capacitance and decreases the reduction of the positive temperature coefficient of the capacitor.

(2) With a capacitor of an equal positive temperature coefficient, the temperature compensation ability is increased twice or more as compared with the fifth practical example.

The advantages of the seventh and eighth practical examples are;

(1) The thermistor of BT=4,000 Kelvin, for example, consolidates the compensation in the low temperature range.

(2) This effect, if estimated in terms of expansion of the allowable range of the angle of the normal to the major surface of the AT cut plate, is twice or more times greater than that of the conventional TCXO, so that the cost of the whole of the crystal oscillator can be reduced.

(3) In addition, these examples can substantially inherit the above-mentioned effects of the fifth and sixth practical examples. The use of the thermistor reduces the effect relating to gm slightly as compared with the fifth and sixth practical examples. However, the superiority to the conventional TCXO is significant in particular with the effect mentioned in (2) above.

As to the ninth practical example;

(1) It is possible to obtain desired positive temperature coefficients of CB and CD individually, and to absorb deviations of CB and CD from designed values. This effect, estimated in terms of extent of the allowable deviation of the angle of the normal to the major surface of the AT cut plate, is four times or more greater than that of the conventional TCXO though the estimation differs in accordance with the viewpoint. This example can reduce the cost sharply by improving the yield.

(2) In order to correct the circuit constants, the conventional TCXO system requires a troublesome replacement of circuit components including an operation to remove a soldered joint, an operation to change components, and an operation for re-soldering. This practical example according to the present invention employs a hardware system of switches or a software switching means, and allows the design by the off-line simulation or the operation of fixing the switches in the predetermined temperature environment (in the oven of 70° C., for example). Therefore, this practical example is suitable to the automatization, and capable of reducing the number of operations and the production cost.

As to the tenth practical example;

(1) The tenth examples can inherit all the effects of the fifth to ninth practical examples.

(2) It is easy to strengthen the compensating function in the high temperature range, so that a characteristic curve after compensation can be a pseudo curve of fifth order (3) Therefore, this example can further widen the allowable deviation of the angle of the normal to the major surface of the AT cut plate, to the extent of five times or more as compared with the conventional TCXO.

The advantages of the eleventh and twelfth practical examples are given below;

(1) These examples can inherit the effects of the preceding examples of the second embodiment.

(2) The estimation of allowable deviation in the angle of the normal to the major surface of the AT cut plate is very difficult because the it is determined by the shares in the compensating function of the temperature compensation voltage generating circuit, and the other circuit section. However, these are in the form of a sum increasing expansion vectors mutually, and the current technique of fabricating AT cut plate is approaching the region in which the allowable deviation is not problematical.

The second embodiment is applicable to a discrete type circuit configuration as in the thirteenth practical example, and capable of reducing the size and cost of the discrete type system.

According to one of possible interpretations of the first embodiment of the present invention, a digital temperature compensated crystal oscillator system comprises:

a crystal oscillating section (such as the items 16, 19) for producing an output signal of an output frequency with a crystal unit (such as 19);

a temperature to voltage converting circuit (such as 10) for sensing an ambient temperature of said crystal unit and outputting an analog temperature voltage signal (such as Vt) representing a sensed ambient temperature;

a memory and operation circuit (such as 12) for storing a collection of temperature compensation data items, receiving a digital temperature signal (such as T) as an input signal (such as an address input), providing a selected data item in accordance with said digital temperature signal, and producing a digital compensation data signal (such as V1) in accordance with said selected data item;

a data converting means (such as 50) for producing said digital temperature data signal (such as T) in accordance with said analog temperature voltage signal (such as Vt) from said temperature to voltage converting circuit, and for producing an analog compensation signal (such as Vcw) in accordance with said digital compensation data signal (such as V1) from said memory and operation circuit; and a voltage to capacitance converting circuit for varying a control capacitance (Cc) in accordance with said analog compensation signal (Vcw) to hold the output frequency independent of changes in the ambient temperature;

wherein said data converting means (such as 50) comprises an analog signal generating section (such as 40) for producing an analog output signal (such as Vd) in response to a digital input signal (such as Td or V1), a comparator section (such as 42) for receiving a first input signal (such as 2VB−Vt) produced in accordance with said analog temperature signal (Vt) of said temperature to voltage converting circuit and a second input signal which is said analog output signal (Vd) of said analog signal generating section and for comparing said first and second input signals to produce a comparator output signal (44A), a register section (such as 44) for receiving said comparator output signal and producing said digital temperature signal (T) and a digital intermediate signal (Td), an operational amplifier section (such as 43) for producing said analog compensation signal (Vcw).

In this digital temperature compensated crystal oscillator system, said data converting means (50) further comprises a switching means (such as 41A, 41B, 41C, 61, 17) for switching said data converting means between an ADC mode and a DAC mode. In the ADC mode, said analog signal generating section (40) is connected to said comparator section (42) to supply said analog output signal (Vd) to said comparator section and disconnected from said operational amplifier section (43), and said analog signal generating section (40) is further connected with said register section (44) to receive said digital intermediate signal (Td). In the DAC mode, said analog signal generating section (40) is disconnected from said comparator section (42) and instead connected to said operational amplifier section (43), and said analog signal generating section (40) is disconnected from said register section (44) and connected with said memory and operation circuit (12) to receive said digital compensation signal (V1) therefrom.

In some examples, the analog signal generating section (40), the comparator section (42) and the register section (44) are combined in the ADC mode to constitute a successive-approximation converter, and the analog signal generating section (40) and the operational amplifier section (43) are combined in the DAC mode to form a digital to analog converter. In this case, the register section (44) includes at least a successive approximation register (S/A register or sequencing register). The successive approximation system can readily produce the temperature data.

The analog signal generating section (40) of the illustrated examples comprises a resistor string circuit (40A) and a decode switch circuit (40B) which are used in common for the ADC and DAC operations. This arrangement can reduce the area of the resistor array approximately by half, and enable the size reduction of LSI and DTCXO.

The section for producing the analog voltage may be controlled in a manner of time sharing. This arrangement can contribute to the size reduction of DTCXO.

The system may further comprise a modifying circuit (such as 14) for producing a control voltage signal (such as Vc) in accordance with said analog compensation signal (Vcw), for example with a sample and hold circuit and a low pass filter circuit.

Either or both of the comparator section (42) and the operational amplifier section (43) may comprise an operational amplifier and a means for adjusting the gain of the operational amplifier. This arrangement can increase the flexibility in the circuit design.

Each decode switch may be composed of a single FET so that the size and cost can be reduced.

The lower limit voltage of said resistor string circuit may be set approximately equal to or greater than 0.1 V so as to retrain an input voltage range of said operational amplifier, and the oscillator system may be arranged to provide a required control voltage with a buffer amplifier disposed after the DAC supplementary circuit or the low pass filter. In this case, the input side of the buffer amplifier is connected with the output terminal of the DAC supplementary circuit 43, or alternatively with the output terminal of the low pass filter. This arrangement can stabilize the operation of the operational amplifier.

In one example of the first embodiment, the second switch circuit is omitted by making the time constant of the low pass filter connected with the output side of the DAC supplementary circuit (43) sufficiently greater than the ADC conversion time. This arrangement can reduce the size and power consumption of the system.

What is claimed is:

1. A digital temperature compensated crystal oscillator system comprising:

a voltage controlled oscillator comprising a crystal unit;

a temperature to voltage converting circuit for sensing an ambient temperature of said crystal unit and outputting an analog temperature voltage signal representing a sensed ambient temperature;

a memory and operation circuit for storing a collection of temperature compensation data items, receiving a digital temperature data signal as an input signal, providing a selected data item identified by said digital temperature data signal, and producing a digital compensation data signal in accordance with said selected data item; and a data conversion circuit for producing said digital temperature data signal in accordance with said analog temperature voltage signal from said temperature to voltage converting circuit, and for producing an analog compensation voltage signal in accordance with said digital compensation data signal from said memory and operation circuit, said data conversion circuit comprising a first section for receiving a digital input signal and producing an analog intermediate signal in response to said digital input signal, a second section for receiving said analog intermediate signal from said first section and said analog temperature voltage signal from said temperature to voltage converting circuit, and producing said digital temperature data signal by converting said analog temperature voltage signal in accordance with said analog intermediate signal and delivering said digital temperature data signal to said memory and operation circuit, and a third section for receiving said analog intermediate signal from said first section and producing said analog compensation voltage signal by converting said digital compensation data signal through said first section which receives said digital compensation data signal as said digital input signal from said memory and operation circuit, said third section delivering said analog compensation voltage signal to said voltage controlled oscillator.

2. A digital temperature compensated crystal oscillator system as claimed in claim 1 wherein said third section of said data conversion circuit is connected to said voltage controlled oscillator, and said data conversion circuit further comprises a first switch circuit comprising an input terminal connected to said first section, a first output terminal connected to said second section, and a second output terminal connected to said third section, and alternating between a first switch state in which said input terminal is connected to said first output terminal and disconnected from said second output terminal, and a second switch state in which said input terminal is disconnected from said first output terminal and connected to said second output terminal.

3. A digital temperature compensated crystal oscillator system as claimed in claim 1:

wherein an output terminal of said second section of said data conversion circuit is connected to an address input terminal of said memory and operation circuit, and said digital temperature data signal is sent as an address signal from said second section to said address input terminal of said memory and operation circuit;

wherein said third section of said data conversion circuit is connected to said voltage controlled oscillator so that said analog compensation data signal is supplied to said voltage controlled oscillator during a normal operation of said oscillator;

wherein said temperature compensation data items stored in said memory and operation circuit represent values of a temperature compensation quantity which is a function dependent only on temperature, and said memory and operation circuit comprises a memory for providing a value of said temperature compensation quantity corresponding to a value of the temperature in a predetermined temperature range; and wherein said digital temperature compensated crystal oscillator system further comprises a low pass filter circuit for receiving said analog compensation voltage signal from said third section of said data conversion circuit.

4. A digital temperature compensated crystal oscillator system comprising:

a temperature to voltage converting circuit for sensing an ambient temperature of a crystal unit and outputting an analog temperature voltage signal representing a sensed ambient temperature;

a memory and operation circuit for storing a collection of temperature compensation data items, receiving a digital temperature data signal as an input signal, providing a selected data item identified by said digital temperature data signal, and producing a digital compensation data signal in accordance with said selected data item; and a data conversion circuit for producing said digital temperature data signal in accordance with said analog temperature voltage signal from said temperature to voltage converting circuit, and for producing an analog compensation voltage signal in accordance with said digital compensation data signal from said memory and operation circuit, said data conversion circuit comprising a first section for producing an analog intermediate signal, a second section for producing said digital temperature data signal by converting said analog temperature voltage signal in accordance with said analog intermediate signal and delivering said digital temperature data signal to said memory and operation circuit, and a third section for producing said analog compensation voltage signal by converting said digital compensation data signal through said first section;

wherein said first section comprises a resistor string circuit comprising a series combination of resistors for receiving a voltage reference and providing a plurality of voltage levels, and a decode switch circuit for selecting one of the voltage levels provided by the resistor string circuit; said second section comprises an ADC supplementary circuit for producing a biased voltage signal by receiving said analog temperature signal and producing a comparator output signal by comparing said analog intermediate signal from said first section with said biased voltage signal, and a temperature data generating section for performing a count down operation in accordance with said comparator output signal from said ADC supplementary circuit and producing a digital intermediate signal; said third section comprises a DAC supplementary circuit for producing said analog compensation signal; and said data conversion circuit further comprises a first switch circuit for supplying said analog intermediate signal from said first section to a selected one of said ADC supplementary circuit and said DAC supplementary circuit, and a second switch circuit for controlling said decode switch circuit by sending, to said decode switch circuit, a selected one of said digital intermediate signal produced by said temperature data generating section and said digital compensation data signal produced by said memory and operation circuit.

5. An oscillator system as claimed in claim 4 wherein said first and second switch circuits are operatively connected with each other.

6. An oscillator system as claimed in claim 4 wherein said data conversion circuit is arranged to produce digital data bit by bit by a successive approximation in accordance with said comparator output signal from said ADC supplementary circuit.

7. An oscillator system as claimed in claim 4 wherein said first section of said data conversion circuit is used for ADC and DAC by time sharing.

8. An oscillator system as claimed in claim 4 wherein said data conversion circuit further comprises a third switch circuit for grounding an input side of said ADC supplementary circuit when said ADC supplementary circuit is in an inoperative state, and for grounding an input side of said DAC supplementary circuit when said DAC supplementary circuit is in an inoperative state.

9. An oscillator system as claimed in claim 4 wherein said first switch circuit comprises a wired OR.

10. An oscillator system as claimed in claim 4 wherein each of said ADC supplementary circuit and said DAC supplementary circuit comprises an operational amplifier, and a gain setting means for controlling a gain of said operational amplifier.

11. An oscillator system as claimed in claim 10 wherein an output voltage range of said resistor string circuit is approximately equal to or smaller than a half of a supply voltage, said decode switch circuit comprises a decode switch composed of a single FET, and said oscillator system is arrange to provide a required control voltage with said operational amplifier.

12. An oscillator system as claimed in claim 10 wherein a lower limit voltage of said resistor string circuit is approximately equal to or greater than 0.1 V so as to retrain an input voltage range of said operational amplifier, and said oscillator system is arranged to provide a required control voltage with a buffer amplifier after said DAC supplementary circuit or a low pass filter.

13. A digital temperature compensated crystal oscillator system comprising:

a temperature to voltage converting circuit for sensing an ambient temperature of a crystal unit and outputting an analog temperature voltage signal representing a sensed ambient temperature;

a memory and operation circuit for storing a collection of temperature compensation data items, receiving a digital temperature data signal as an input signal, providing a selected data item identified by said digital temperature data signal, and producing a digital compensation data signal in accordance with said selected data item; and a data conversion circuit for producing said digital temperature data signal in accordance with said analog temperature voltage signal from said temperature to voltage converting circuit, and for producing an analog compensation voltage signal in accordance with said digital compensation data signal from said memory and operation circuit, said data conversion circuit comprising a first section for producing an analog intermediate signal, a second section for producing said digital temperature data signal by converting said analog temperature voltage signal in accordance with said analog intermediate signal and delivering said digital temperature data signal to said memory and operation circuit, and a third section for producing said analog compensation voltage signal by converting said digital compensation data signal through said first section;

wherein said first section comprises a resistor string circuit comprising a series combination of resistors for receiving a voltage reference and providing a plurality of voltage levels, and a decode switch circuit for selecting one of the voltage levels provided by the resistor string circuit;

wherein said second section comprises an ADC supplementary circuit for producing a biased voltage signal by receiving said analog temperature signal and producing a comparator output signal by comparing said analog intermediate signal from said first section with said biased voltage signal, and a temperature data generating subsection for performing a count down operation in accordance with said comparator output signal from said ADC supplementary circuit and producing a digital intermediate signal;

wherein said third section comprises a DAC supplementary circuit for producing said analog compensation signal;

wherein said data conversion circuit further comprises a first connecting means comprising a first switch circuit for supplying said analog intermediate signal from said first section to a selected one of said ADC supplementary circuit and said DAC supplementary circuit, and a second connecting means for supplying one of said digital intermediate signal produced by said temperature data generating subsection and said digital compensation data signal produced by said memory and operation circuit; and wherein said DAC supplementary circuit is connected to a low pass filter having a time constant which is greater than an ADC conversion time.

14. A temperature compensated crystal oscillator system comprising:

a crystal unit having a first end and a second end, the second end being connected to a ground;

a MOS transistor comprising a drain, a source and a gate, the gate being connected to said first end of said crystal unit;

a gate voltage fixing resistor connected between the drain and gate of the MOS transistor;

a source resistor connected between the source of the MOS transistor and the ground;

a series circuit of a detecting capacitor and a feedback semiconductor capacitor constituting a Colpitts oscillator circuit; and a decoupling capacitor connected between the source of the MOS transistor and a node between the detecting capacitor and the feedback semiconductor capacitor.

15. An oscillator system as claimed in claim 14 wherein said feedback capacitor is a transistor type variable capacitor.

16. An oscillator system as claimed in claim 14 wherein each of said gate voltage fixing resistor and said source resistor is a polysilicon resistor.

17. An oscillator system as claimed in claim 14 wherein said oscillator system comprises a second semiconductor capacitor connected between said second end of said crystal unit and the ground, so that a series circuit of said crystal unit and said second semiconductor capacitor is connected between the gate of said MOS transistor and the ground.

18. An oscillator system as claimed in claim 14 wherein said oscillator system comprises a thermistor connected between said second end of said crystal unit and the ground, so that a series circuit of said crystal unit and said thermistor is connected between the gate of said MOS transistor and the ground.

19. An oscillator system as claimed in claim 14 wherein said oscillator system comprises a thermistor comprising a first end connected with said second end of said crystal unit and a second end, and a second semiconductor capacitor comprising a first end connected with said second end of said thermistor and a second end connected to the ground, so that a series circuit of said crystal unit, said thermistor and said second semiconductor capacitor is connected between the gate of said MOS transistor and the ground.

20. An oscillator system as claimed in claim 14 wherein said oscillator system comprises a plurality of said semiconductor capacitors which are connected in parallel to form a first parallel circuit, and said oscillator system further comprises a second parallel circuit of capacitors having a temperature coefficient smaller than that of said first parallel circuit, and said second parallel circuit is connected in parallel to said first parallel circuit.

21. An oscillator system as claimed in claim 14 wherein said oscillator system further comprises a high temperature range temperature compensation circuit comprising a parallel series circuit of a thermistor, and a fixed capacitor.

22. An oscillator system as claimed in claim 14 wherein said oscillator system further comprises a temperature compensation voltage generating circuit which is connected between said feedback semiconductor capacitor and the ground, for supplying a reverse bias voltage to said feedback semiconductor capacitor to vary the capacitance of said feedback capacitor, and a resistor connected between the node between said detecting and feedback capacitors and the ground.

23. An oscillator system as claimed in claim 17 wherein said oscillator system further comprises a temperature compensation voltage generating circuit for varying the capacitance of each of said feedback semiconductor capacitor and said second semiconductor capacitor by applying a temperature compensation voltage, said temperature compensation voltage generating circuit comprises a first terminal connected with each of said feedback semiconductor capacitor and said second semiconductor capacitor, and a second terminal connected to the ground, and said oscillator system further comprises a resistor connected between the node between said detecting capacitor and feedback capacitor and the ground, and a resistor connected between the node between said crystal unit and said second semiconductor capacitor and the ground.

24. An oscillator system as claimed in claim 14 wherein said feedback semiconductor capacitor has a temperature coefficient which is positive.

25. An oscillator system as claimed in claim 17 wherein said second semiconductor capacitor has a temperature coefficient which is positive.

* * * * *